US010964676B2

(12) United States Patent
Yazdani

(10) Patent No.: US 10,964,676 B2
(45) Date of Patent: Mar. 30, 2021

(54) SEMICONDUCTOR STRUCTURE AND A METHOD OF MAKING THEREOF

(71) Applicant: BroadPak Corporation, San Jose, CA (US)

(72) Inventor: Farhang Yazdani, Santa Clara, CA (US)

(73) Assignee: BroadPak Corporation, San Jose, CA (US)

( * ) Notice: Subject to any disclaimer, the term of this patent is extended or adjusted under 35 U.S.C. 154(b) by 0 days.

(21) Appl. No.: 16/035,623

(22) Filed: Jul. 14, 2018

(65) Prior Publication Data

US 2018/0342489 A1 Nov. 29, 2018

Related U.S. Application Data

(63) Continuation of application No. 15/164,866, filed on May 25, 2016, now Pat. No. 10,026,720, which is a (Continued)

(51) Int. Cl.
*H01L 25/065* (2006.01)
*H01L 25/10* (2006.01)

(Continued)

(52) U.S. Cl.
CPC .......... *H01L 25/105* (2013.01); *H01L 21/486* (2013.01); *H01L 21/52* (2013.01); *H01L 23/04* (2013.01); *H01L 23/13* (2013.01); *H01L 23/147* (2013.01); *H01L 23/3107* (2013.01); *H01L 23/36* (2013.01); *H01L 23/467* (2013.01); *H01L 23/49816* (2013.01); *H01L 23/49827* (2013.01); *H01L 23/49833* (2013.01); *H01L 23/49838* (2013.01); *H01L 23/5385* (2013.01); *H01L 23/573* (2013.01); *H01L 23/66* (2013.01); *H01L 25/0652* (2013.01); *H01L 25/0657* (2013.01); *H01L 25/18* (2013.01); *H01L 25/50* (2013.01); *H01L 23/5383* (2013.01); *H01L 24/13* (2013.01); *H01L 24/16* (2013.01); *H01L 24/48* (2013.01); *H01L 2224/13101* (2013.01); *H01L 2224/13147* (2013.01); *H01L 2224/45015* (2013.01);

(Continued)

(58) Field of Classification Search
CPC ... H01L 25/0657; H01L 25/074; H01L 25/117
See application file for complete search history.

(56) References Cited

U.S. PATENT DOCUMENTS

2006/0065972 A1* 3/2006 Khan ................. H01L 23/3677 257/712
2006/0113653 A1* 6/2006 Xiaoqi .................... H01L 25/18 257/686

(Continued)

*Primary Examiner* — Jae Lee
(74) *Attorney, Agent, or Firm* — Aslan Law, P.C.

(57) ABSTRACT

An integrated circuit package comprising a first substrate having a cavity; a second substrate; and one or more semiconductor device(s) and/or passive component (s) are coupled to the second substrate. The cavity is formed using two opposite side walls of the first substrate where two opposite sides of the cavity are kept open, the one or more semiconductor device(s) and/or passive component(s) is/are electrically coupled using redistribution layers, and the second substrate is located inside the cavity of the first substrate.

50 Claims, 21 Drawing Sheets

1000
45Atop
90Atop
90Abottom
96Abottom
96Atop
50Atop
52Atop
48Atop
600
94A
substrate
Die-1
Die-2
substrate
610
PCB or (organic substrate or glass substrate), Or Silicon
620
substrate
Die-2
Die-1
substrate
610
Copper (heat spreader)
550
substrate
45Abottom
50Abottom
52Abottom
48Abottom
substrate
620
substrate
Die-1
Die-2
substrate
630
Interposer
PCB or (organic substrate or glass substrate), Or Silicon
Interposer
substrate
Die-2
Die-1
substrate
94B
640
96Btop
50Btop
52Atop
90Btop
48Btop
630
96Bbottom
52Bbottom
48Bbottom
45Bbottom
50Bbottom
90Bbottom
46Btop

Related U.S. Application Data continuation-in-part of application No. 14/746,045, filed on Jun. 22, 2015, now Pat. No. 9,818,680, and a continuation-in-part of application No. 14/717,798, filed on May 20, 2015, now Pat. No. 9,893,004, which is a continuation-in-part of application No. 13/192,217, filed on Jul. 27, 2011, now Pat. No. 10,236,275, which is a continuation of application No. 12/205,875, filed on Sep. 6, 2008, now Pat. No. 8,014,166.

(60) Provisional application No. 62/166,123, filed on May 25, 2015, provisional application No. 62/015,459, filed on Jun. 22, 2014, provisional application No. 62/002,794, filed on May 24, 2014.

(51) Int. Cl.

| | |
|---|---|
| ***H01L 23/00*** | (2006.01) |
| ***H01L 23/66*** | (2006.01) |
| ***H01L 25/18*** | (2006.01) |
| ***H01L 25/00*** | (2006.01) |
| ***H01L 23/13*** | (2006.01) |
| ***H01L 23/36*** | (2006.01) |
| ***H01L 23/467*** | (2006.01) |
| ***H01L 23/498*** | (2006.01) |
| ***H01L 23/538*** | (2006.01) |
| ***H01L 23/14*** | (2006.01) |
| ***H01L 23/04*** | (2006.01) |
| ***H01L 23/31*** | (2006.01) |
| ***H01L 21/48*** | (2006.01) |
| ***H01L 21/52*** | (2006.01) |

(52) U.S. Cl.

CPC ............... *H01L 2224/48091* (2013.01); *H01L 2224/48227* (2013.01); *H01L 2225/06513* (2013.01); *H01L 2225/06517* (2013.01); *H01L 2225/06527* (2013.01); *H01L 2225/06541* (2013.01); *H01L 2225/06548* (2013.01); *H01L 2225/06572* (2013.01); *H01L 2225/1041* (2013.01); *H01L 2225/1052* (2013.01); *H01L 2225/1082* (2013.01); *H01L 2225/1094* (2013.01); *H01L 2924/00014* (2013.01); *H01L 2924/10253* (2013.01); *H01L 2924/14* (2013.01); *H01L 2924/15192* (2013.01); *H01L 2924/19041* (2013.01); *H01L 2924/19107* (2013.01); *H01L 2924/30107* (2013.01); *Y10T 29/53174* (2015.01); *Y10T 29/53178* (2015.01); *Y10T 29/53183* (2015.01)

(56) References Cited

U.S. PATENT DOCUMENTS

| | | | | |
|---|---|---|---|---|
| 2007/0290338 | A1* | 12/2007 | Kuczynski | H01L 23/26<br>257/737 |
| 2013/0032390 | A1* | 2/2013 | Hu | H01L 23/147<br>174/266 |
| 2013/0051127 | A1* | 2/2013 | Parris | G11C 11/4072<br>365/149 |
| 2014/0008773 | A1* | 1/2014 | Yen | H01Q 1/38<br>257/664 |
| 2014/0035154 | A1* | 2/2014 | Geitner | H01L 23/66<br>257/774 |
| 2014/0242927 | A1* | 8/2014 | Mooney | H04B 1/40<br>455/90.2 |
| 2014/0266919 | A1* | 9/2014 | Chen | H01L 23/66<br>343/700 MS |
| 2015/0091131 | A1* | 4/2015 | Lamorey | H01L 25/50<br>257/532 |
| 2015/0279828 | A1* | 10/2015 | Koopmans | H01L 25/0652<br>257/713 |
| 2015/0359098 | A1* | 12/2015 | Ock | H01L 25/16<br>361/782 |
| 2016/0093563 | A1* | 3/2016 | Chen | H01L 23/49816<br>361/752 |
| 2016/0240481 | A1* | 8/2016 | Chen | H01L 23/5385 |
| 2016/0311676 | A1* | 10/2016 | Steimle | B81B 3/0072 |

* cited by examiner

SEMICONDUCTOR STRUCTURE AND A METHOD OF MAKING THEREOF

CROSS REFERENCE TO RELATED APPLICATIONS

This application claims the benefit of priority to and is a continuation of U.S. patent application Ser. No. 15/164,866 filed May 25, 2016, the content of which is incorporated herein by reference in its entirety.

This application claims the benefit of priority under 35 U.S.C. § 119(e) to U.S. provisional application Ser. No. 62/166,123 filed May 25, 2015, the content of which is incorporated herein by reference in its entirety.

The present application claims the benefit of priority to and is a continuation in part of U.S. patent application Ser. No. 14/717,798 filed May 20, 2015 now U.S. Pat. No. 9,893,004 (issued on Feb. 13, 2018), the content of which is incorporated herein by reference in its entirety.

This application claims the benefit of priority to and is a continuation in part of U.S. patent application Ser. No. 14/746,045 filed Jun. 22, 2015 now U.S. Pat. No. 9,818,680 (issued on Nov. 14, 2017), the content of which is incorporated herein by reference in its entirety.

Application Ser. No. 14/746,045 claims the benefit of priority under 35 U.S.C. § 119(e) to U.S. provisional application Ser. No. 62/015,459 filed Jun. 22, 2014, the content of which is incorporated herein by reference in its entirety.

Application Ser. No. 14/717,798 claims the benefit of priority under 35 U.S.C. § 119(e) to U.S. provisional application Ser. No. 62/002,794 filed May 24, 2014, the content of which is incorporated herein by reference in its entirety.

Application Ser. No. 14/717,798 claims the benefit of priority to and is a continuation in part of U.S. patent application Ser. No. 13/192,217 filed Jul. 27, 2011, the content of which is incorporated herein by reference in its entirety.

Application Ser. No. 13/192,217 claims the benefit of priority to and is a continuation of U.S. patent application Ser. No. 12/205,875 filed Sep. 6, 2008 now U.S. Pat. No. 8,014,166 (issued on Sep. 6, 2011), the content of which is incorporated herein by reference in its entirety.

FIELD OF THE INVENTION

The subject matter herein relates to semiconductor devices and packaging of the semiconductor devices.

BACKGROUND OF THE INVENTION

As Moore's law approaches its demise and the cost per transistor increases below the 22 nm node, device makers are pushed to seek alternative solutions to achieve higher yield, shorter interconnect length, lower delays, lower power, smaller footprint, reduced weight and higher performance. In a homogeneous 2.5D/3D integration approach, a single chip is partitioned into a number of smaller chips. The smaller chips are then assembled on an interposer and wired together to form a functional chip. In a heterogeneous 2.5D/3D integration approach, a single chip consists of a number of circuitry blocks such as memory, logic, DSP, and RF, each separated into a smaller chip. The smaller chips can be manufactured by different foundries and can be of different process nodes. The smaller chips are then assembled on an interposer and wired together to form a functional chip.

The semiconductor industry has been transitioning from a 2D monolithic approach to a 2.5D/3D heterogeneous approach at a much slower rate than expected, mainly due to high costs. The high costs arise from manufacturing, poor reliability, and low yield. Establishing a supply chain for a 2.5D/3D device depends on the device market and volume. However, costs, reliability, and yield are the fronts that are hitting the industry the most.

A silicon interposer is the building block and an enabler for 2.5D/3D integration, whether homogeneous or heterogeneous. In a conventional silicon interposer manufacturing flow, blind vias with a diameter of 10 um are created within the wafer followed by back-grinding the wafer to 100 um nominal in order to reveal the vias from the backside, creating what is known as through-silicon vias (TSV). Such an interposer is known as an interposer with 10:100 aspect ratio, implying 10 um via diameter and 100 um interposer thickness. This process is called "wafer thinning and via reveal process." In reality, not all of the blind vias are etched with equal depth, as there is always considerable variation in blind via depth due to process variation. With more than 2 um variation in blind via depth, considerable contamination occurs during the back-grind process in order to reveal all of the blind vias. In general, thinning and the via reveal process has proven to have a tremendously negative impact on the yield and has given the 2.5D/3D integration a reputation as a costly process that is justified only if the market demands the technology and can absorb the associated cost.

As mentioned above, in a conventional 2.5D/3D integration and assembly, a single chip is partitioned into multiple other chips or so-called partitions, whether homogeneous or heterogeneous. Partitions are then bumped using copper pillar bumping technology. Copper pillar is used for fine pitch bumping, normally when the bump pitch is less than 80 micron. A typical partition can have a bump pitch of 45 microns or smaller. Partitions are assembled on a thin silicon interposer with typical aspect ratio of 10:100. The back side of the interposer has a typical bump pitch of 150 micron or more in order to resemble the industry standard flip chip bump pitch in practice as of today and is bumped using solder bump material. The Silicon interposer is then assembled on a multi-layer organic build up substrate. A ball grid array (BGA) with a typical pitch of 1 mm is attached to the back side of the organic substrate. The organic substrate is then assembled on a printed circuit board (PCB).

The conventional silicon interposer TSV manufacturing process with sequential bumping and assemblies has resulted in a costly platform which has inhibited the launch of 2.5D/3D products in many market sectors.

According to industry sources, 40% of the cost associated with manufacturing a silicon interposer is attributed to wafer thinning and the back-grinding via reveal process. A recent independent study sheds light on the cost break down of processing steps required for manufacturing a conventional 31×31 mm2, 100 um thin silicon interposer with 12 um TSV diameter, 3 copper damascene RDL layers with 65 nm design rule for routing on the top layer. According to the study, 19% of the cost contribution is attributed to the wafer thinning and TSV reveal process, 20% to wafer bonding/debonding process, 19% to TSV filling process, 18% to RDL process, 13% to via etching process and only 5% to the bumping process.

The processes related to TSVs include the wafer thinning and TSV reveal process, the wafer bonding and debonding process, and the TSV copper via fill process. These three processes contribute to almost 60% of the overall cost of manufacturing.

Interposers in practice today consist of redistribution layers (RDL), RDL vias, and through substrate/silicon vias (TSVs). Figure OA is a side view of an assembly employing through substrate vias according to prior art. TSVs 10 are used to transition signals 20 and supplies from the top 35 of the substrate 30 to the bottom 40 and vice versa through the substrate core thickness. TSVs are constrained by diameter, height, and pitch. Thus, a limited number of TSVs can be placed in a substrate, moreover, it has a negative impact on signal and power integrity.

BRIEF SUMMARY OF THE INVENTION

A method of creating a scalable 2.5D/3D structure without through substrate vias is disclosed. The method uses a via-less semiconductor interposer, a semiconductor substrate, and various combinations of wirebond, flip chip bumping, and redistribution layers (RDL) to transition signals or supplies to the bottom of the substrate.

DETAILED DESCRIPTION OF THE INVENTION

Figure 1A:
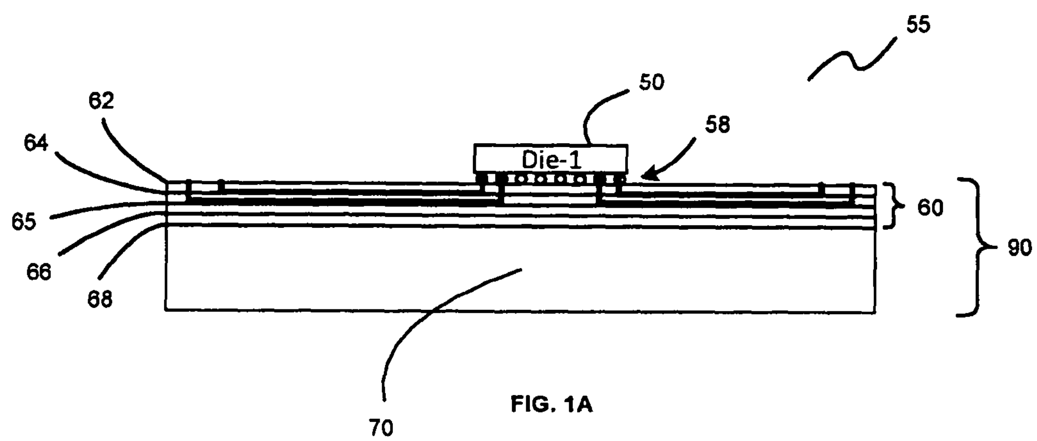
FIGS. 1A, 1B, and 1C are side views of a stacked die structure, in accordance with one exemplary embodiment of the present invention.

The various embodiments are described more fully with reference to the accompanying drawings. These example embodiments are provided so that this disclosure will be thorough and complete, and will fully convey the scope of the invention to readers of this specification having knowledge in the technical field. Like numbers refer to like elements throughout.

Semiconductor packages are described which increase the density of electronic components within. The semiconductor package may incorporate interposers having a multitude of redistribution layers. Relatively narrow and laterally elongated interposers to form the indentations used to house the electronic components. The height of the clearance may be equal to the height of the standoff interposers. The semiconductor package designs described herein may be used to reduce footprint, reduce profile and increase electronic component and transistor density for semiconductor products. The spaces and clearances may form a conduit configured to promote fluid flow and enhance cooling of the electronic components during operation in embodiments.

In some embodiments, the semiconductor packages described herein possess cavities and/or standoff interposers (generally referred to herein as interposer) to create spaces for a plurality of electronic components in a high density and high performance configuration. In some embodiments, the semiconductor packages described may result in a smaller footprint, lower profile, miniaturized, higher performance thermally enhanced, and more secured packages. The packages may involve a combination of interposers, redistribution layers (RDL), zero-ohm links, copper pillars, solder bumps, compression bonding, and bumpless packaging. In addition to these techniques, cavities may be made into the interposer and/or substrate, and/or standoff interposers and secondary or side substrate may be used to provide spaces (clearance) for a plurality of electronic components (e.g., passives, antennas, integrated circuits or chips) in embodiments. The standoff interposers and secondary or side substrate may include RDL on the top and/or bottom. Standoff interposers may be formed, for example, by bonding multiple interposers together by thermocompression bonding or another low-profile connection technique. Oxide bonding techniques or laterally shifting any standoff interposer described herein enable wirebonds to be used to connect the standoff interposer to a printed circuit board, or substrate, or an underlying interposer in embodiments. Generally speaking, any interposer described herein may be shifted relative to the other interposers in the stack to allow the formation of wirebonds. The semiconductor interposer may be a silicon interposer according to embodiments.

A method of creating a scalable 2.5D/3D structure which requires no TSVs is disclosed. This method uses various combinations of wirebond, flip chip bumping, redistribution layer (RDL) with or without RDL vias to transition signals or supplies In other words, signals and supplies are routed through the RDL layers, thus eliminating TSV usage and reducing the cost of manufacturing and improving performance. In addition, an improved method of solder joint reliability is disclosed. Surfaces of assemblies disclosed herein maybe be covered with a high-Z material to create a radiation harden component.

Electronic packages formed in the manner described herein possess improved reliability, lower cost, and higher performance due to a shortening of electrical distance and an increase in density of integrated circuit mounting locations. Reliability may be improved for embodiments which use the same semiconductor (e.g., silicon) for all interposer used to form the semiconductor package. The techniques presented also provide improved in solder joint reliability and a reduction in warpage. Warping may occur during the wafer processing and thinning of the semiconductor interposer. The second opportunity for warping occurs during the package and assembly. The chance of warping increases for larger interposer lengths and package dimensions which is currently necessary for a variety of 2.5D/3D integration applications (e.g., networking). The vertical density of integrated circuits may be increased which allows the horizontal area to be reduced to achieve the same performance.

When describing all embodiments herein, “top” and “up” will be used herein to describe portions/directions perpendicularly distal from the printed circuit board (PCB) plan and further away from the center of mass of the PCB in the perpendicular direction. “Vertical” will be used to describe items aligned in the “up” direction towards the “top.” Other similar terms may be used whose meanings will now be clear. “Major planes” of objects will be defined as the plane which intersects the largest area of an object such as an interposer. Some standoff interposers may be “aligned” in “lines” along the longest of the three dimensions and may therefore be referred to as “linear” standoff interposers. Electrical connections may be made between interposers (standoff or planar interposer) and the pitch of the electrical connections may be between 1 micron and 50 micron or between 10 micron and 100 micron in some embodiments. Electrical connections between neighboring semiconductor interposers herein may be direct ohmic contacts which may include direct bonding/oxide bonding or adding a small amount of metal such as a pad. In the following it is understood that a substrate includes metal layers, vias and other passive components used for transfer of signals.

FIG. 1A is a side view of a TSV-less (i.e., without any through silicon vias) assembly 55 (alternatively referred to herein as structure) in accordance with an exemplary embodiment of the present invention. Assembly 55 is shown as including, in part, a semiconductor die 50 mounted on a interposer 90 via a multitude of electrical signal conductors (e.g., bumps). Interposer 90 is further shown, as including, in part, one or more redistribution layers 60 (RDL), and a substrate 70. Although for simplicity only one such redistribution layer is shown in FIG. 1A, it is understood that layer 60 may include any number of redistribution later, collectively referred to herein as a redistribution layer.

Figure 1B:
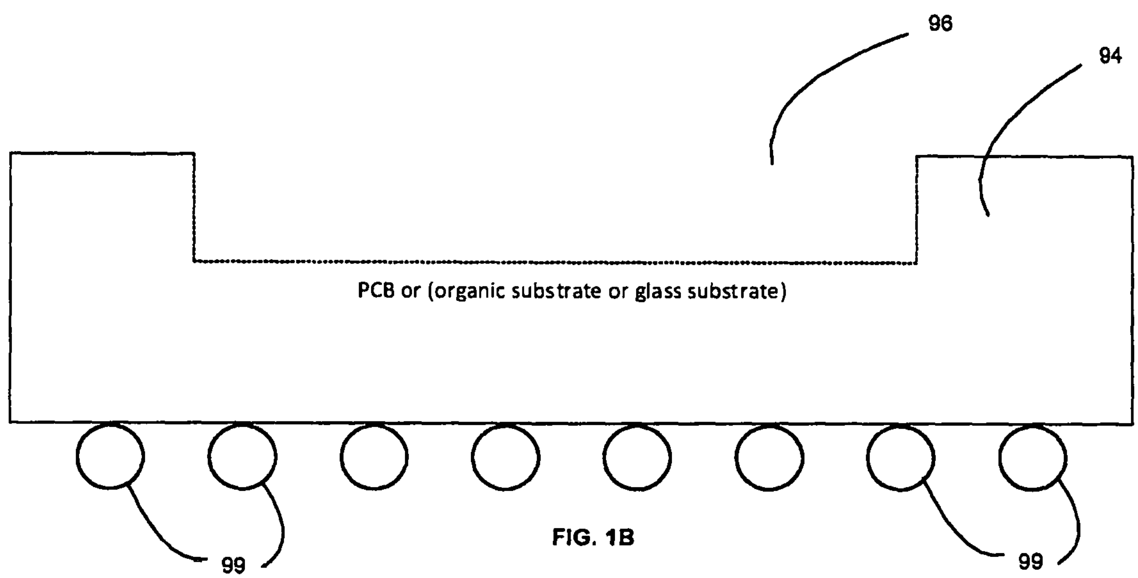
Figure 1C:
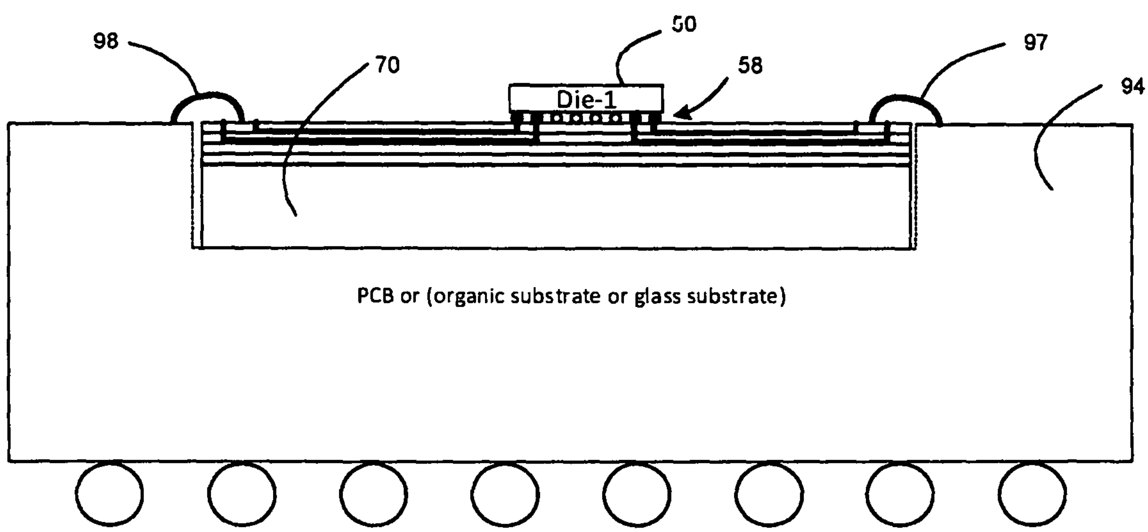

Redistribution layer(s) 60 is shown as including 5 metal layers 62, 64, 65, 66, 68 used to transfer signals to and from semiconductor die 50, as described further below. FIG. 1B is a side view of another substrate 94 having a multitude of electrical signal conductors 99 and a cavity 96 adapted to receive assembly 55 therein. FIG. 1C shows assembly 55 after being disposed in cavity 94. A multitude of wirebonds (two which, namely wirebonds 97 and 98 are shown in FIG. 1C) may be used to transfer signals to and from silicon die 50 via the metal layers disposed in RDL 60. Alternatively, a flip-chip substrate (not shown) may be used in place of the wirebonds to transfer signals between silicon die 50 and substrate 94 over cavity 96. Although for simplicity only five metal layers are shown in redistribution layer 60, it is understood that layer 60 may include any number of metal layers.

Figure 1E:
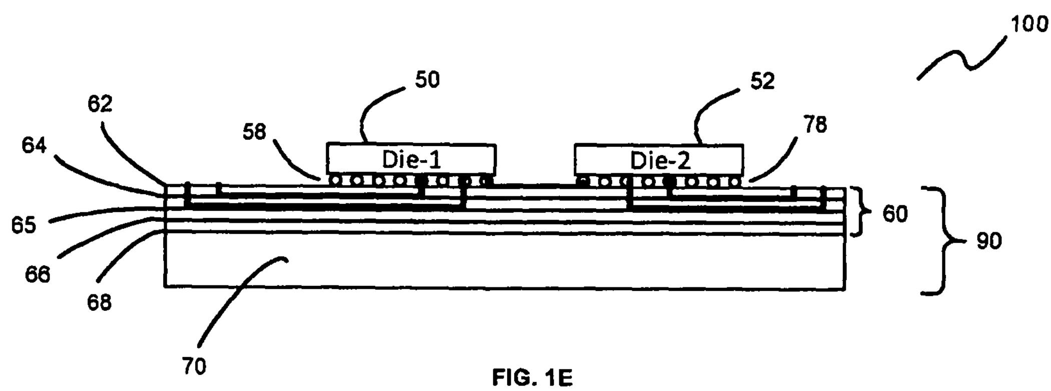
FIGS. 1E, 1F, and 1G are side views of an assembly, in accordance with one exemplary embodiment of the present invention.

FIG. 1E is a side view of a TSV-less assembly 100 in accordance with another exemplary embodiment of the present invention. Assembly 100 is shown as including, in part, semiconductor dies (device) 50 and 52 mounted on interposer 90. Although exemplary embodiment of assembly 100 is shown as including only two semiconductor devices, it is understood that an assembly, in accordance with embodiments of the present invention, may have any number of semiconductor devices.

Semiconductor device 50 is shown as communicating with other devices, such as device 52, or to receive voltage/current supplies via a multitude of electrical signal conductors 58. Likewise, semiconductor device 52 is shown as communicating with other devices, such as device 50, or to receive voltage/current supplies via a multitude of electrical signal conductors 78. Interposer 90 is further shown, as including, in part, one or more redistribution layers 60 (RDL), and a substrate 70. Although for simplicity only one such redistribution layer is shown in FIG. 1E, it is understood that layer 60 may include any number of redistribution later. Redistribution layer(s) 60 is shown as including 5 metal layers 62, 64, 65, 66, 68 used to transfer signals to and from semiconductor devices 50, 52.

Figure 1F:
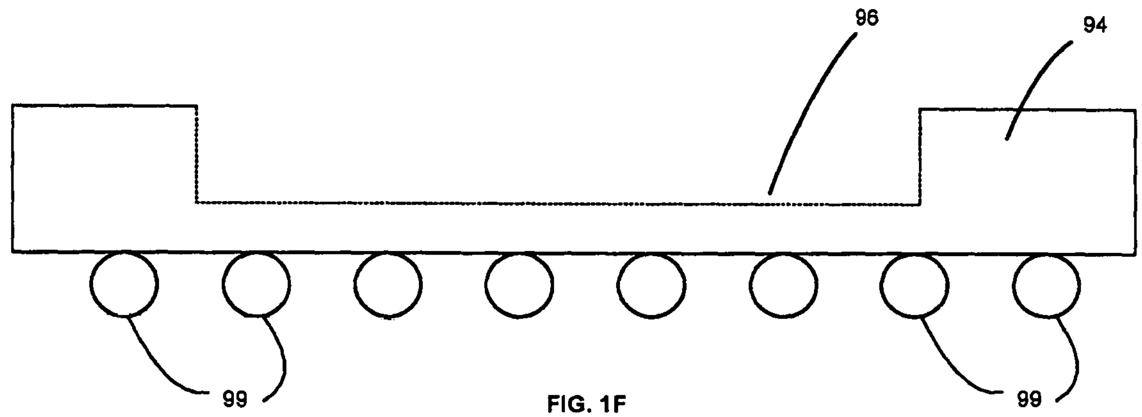
Figure 1G:
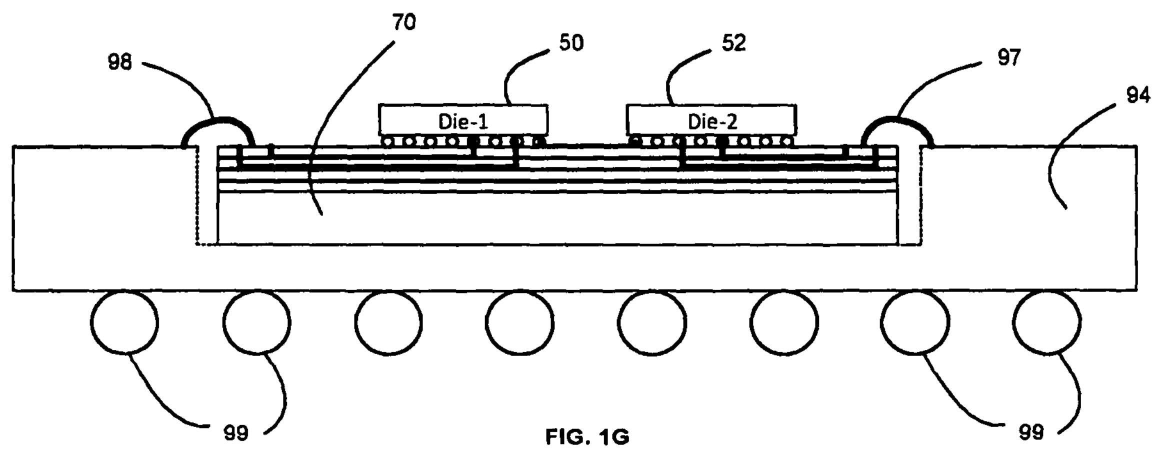
Figure 1H:
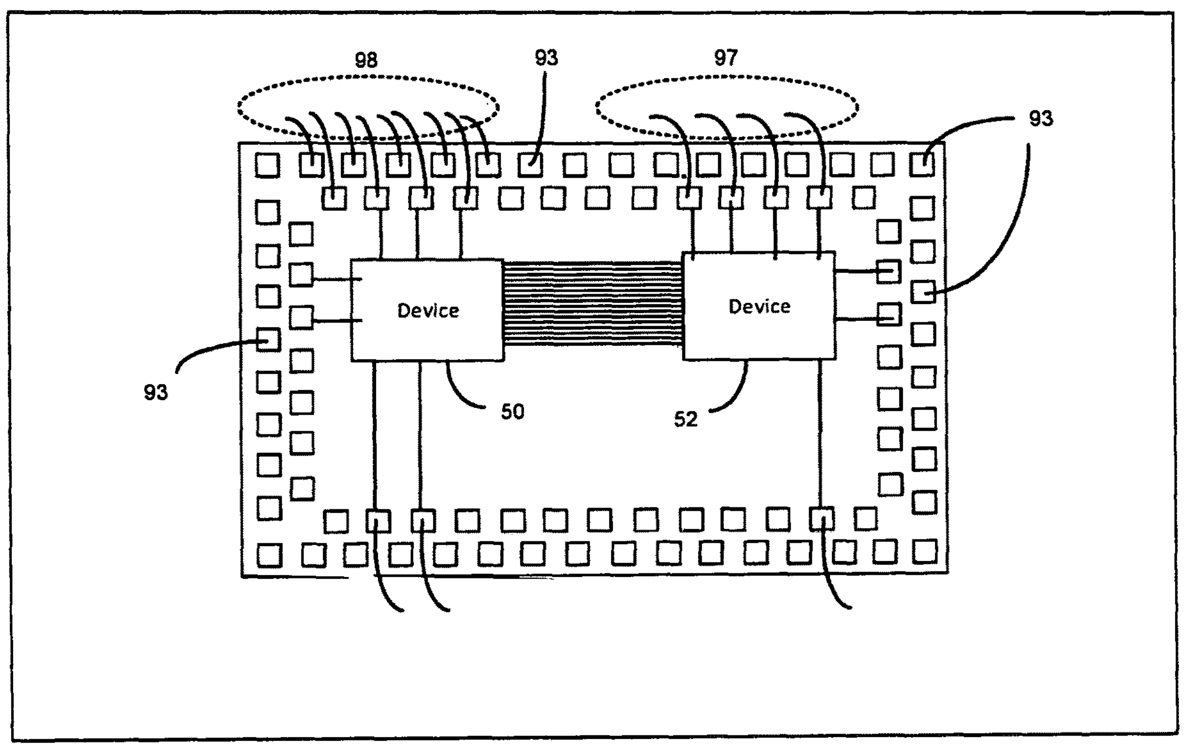
FIG. 1H is a top view of the assembly shown in FIG. 1G.

FIG. 1F is a side view of a substrate 94 having a multitude of electrical signal conductors 99 and a cavity 96 adapted to receive assembly 100 therein. FIG. 1G shows assembly 100 after being disposed in cavity 94. A multitude of wirebonds (two which, namely wirebonds 97 and 98 are shown in FIG. 1C) may be used to transfer signals to, from or between silicon devices 50, 52 via the metal layers disposed in RDL 60. Alternatively, a flip-chip substrate (not shown) may be used in place of the wirebonds to transfer signals to, from or between silicon devices 50, 52 and substrate 94 over cavity 96. Although for simplicity only five metal layers are shown in redistribution layer 60, it is understood that layer 60 may include any number of metal layers. FIG. 1H is a top view of an exemplary embodiment of assembly 100, showing devices 50 and 52, top metal layers 62, wirebonds 97, 98, and bonding pads 93.

Figure 2A:
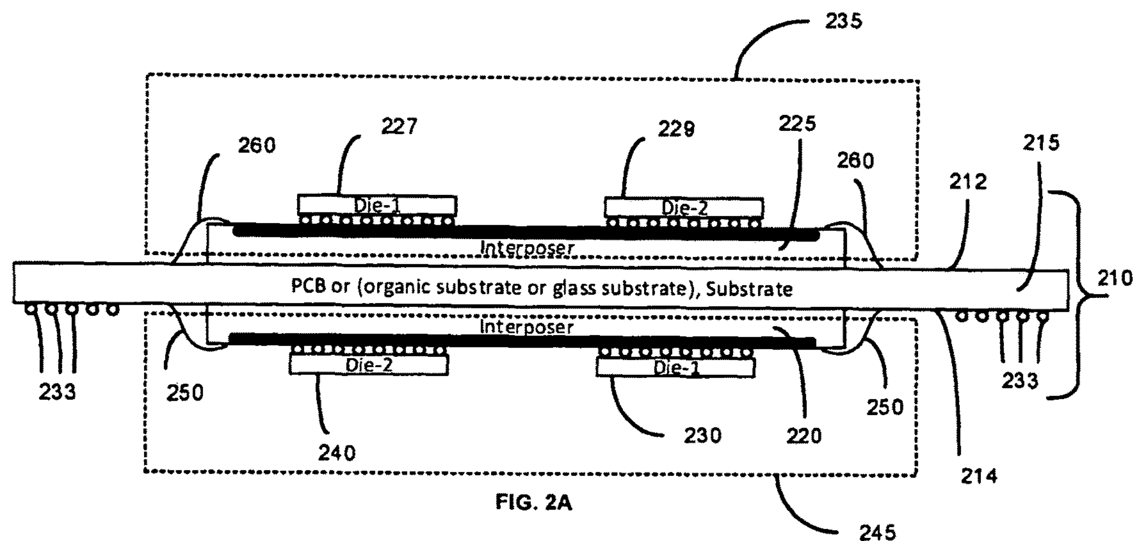
FIG. 2A is a side view of an assembly, in accordance with one exemplary embodiment of the present invention.

FIG. 2A shows an assembly 210 in accordance with another embodiment of the present invention. Devices 227, 229 together with interposer 225 form an assembly 235 that corresponds to and is formed in the same manner as assembly 100 shown in FIG. 1F. Similarly, devices 230, 240 together with interposer 220 form an assembly 245 that corresponds to and is formed in the same manner as assembly 100 shown in FIG. 1F. Assemblies 235 and 245 are mounted to substrate 214 to from an assembly 210. Devices 229, 227, 240 and 230 of assembly 210 are adapted to communicate with one another via wirebonds 250, 260 and the redistribution layers disposed in interposers 220 and 225. Electrical signal conductors 233 (e.g., BGA) facilitate communication between the devices disposed in assembly 210 and devices not formed on assembly 210.

Figure 2B:
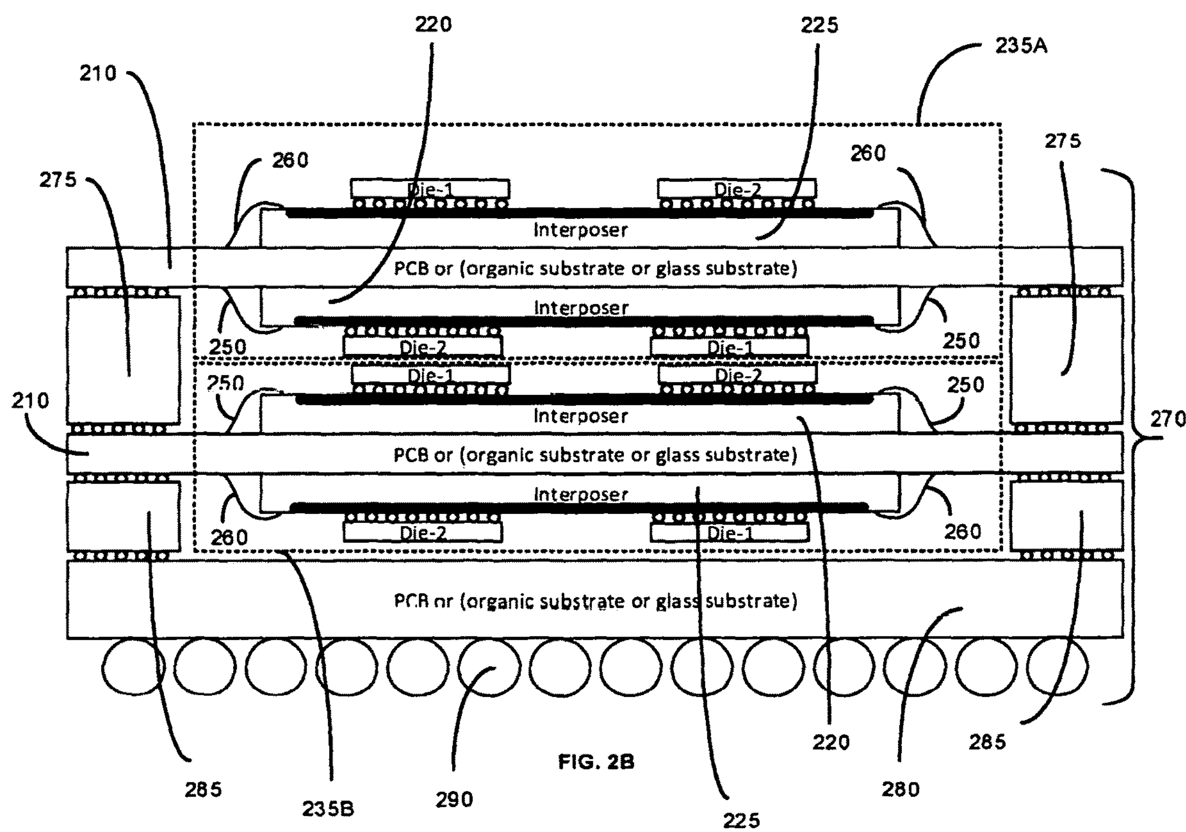
FIG. 2B is a side view of an assembly, in accordance with one exemplary embodiment of the present invention.

FIG. 2B shows an assembly 270 in accordance with another embodiment of the present invention. Assembly 270 is shown, as including, in part, two assemblies 235A and 235, each of which corresponds to assembly 235 shown in FIG. 2A. The devices disposed in assemblies 235A and 235B are adapted to communicate with one another via wirebonds 250, 260 and the redistribution layers disposed in their respective interposers 220 and 225. Electrical signal conductors 290 (e.g., BGA) facilitate communication between the devices disposed in assembly 270 and devices not formed on assembly 270. In one embodiment, substrates 275 disposed between assemblies 235A and 235 surrounds interposers 220 and the devices mounted there to inhibit access to these devices. In yet another embodiment, substrates 275 is disposed along one of the edges of assembly 235 to enable airflow between assemblies 235A and 235 so as to allow for heat flow and dissipation. The following embodiments of the present invention are similar in many aspects to those described above with reference to FIGS. 1A, 1B, 1C, 1D, 1E, 1F, 1G, 1H, 2A, 2B; accordingly, for simplicity and clarity, in the following and where applicable, only the differences between such embodiments are described. It is also understood that similar reference numbers may be used to identify the same elements in the Figures.

Figure 3A:
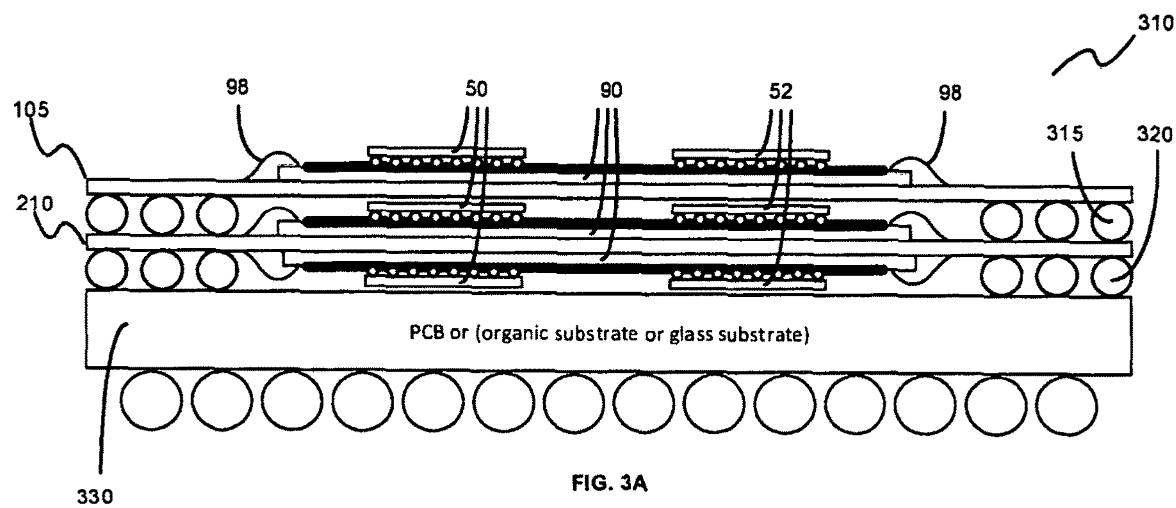
FIG. 3A is a side view of an assembly, in accordance with one exemplary embodiment of the present invention.

FIG. 3A is a cross-section view of stacking of interposers in accordance with an exemplary embodiment. An assembly 310 may include in part multiple assemblies, for example one according to assembly 105 and one according to assembly 210, stacked and separated using a BGA 315 having a ball size and pitch appropriate for providing enough clearance so that devices of the assemblies fit and function properly. Assembly 210 has clearance from substrate 330 due to BGA 320.

Figure 3B:
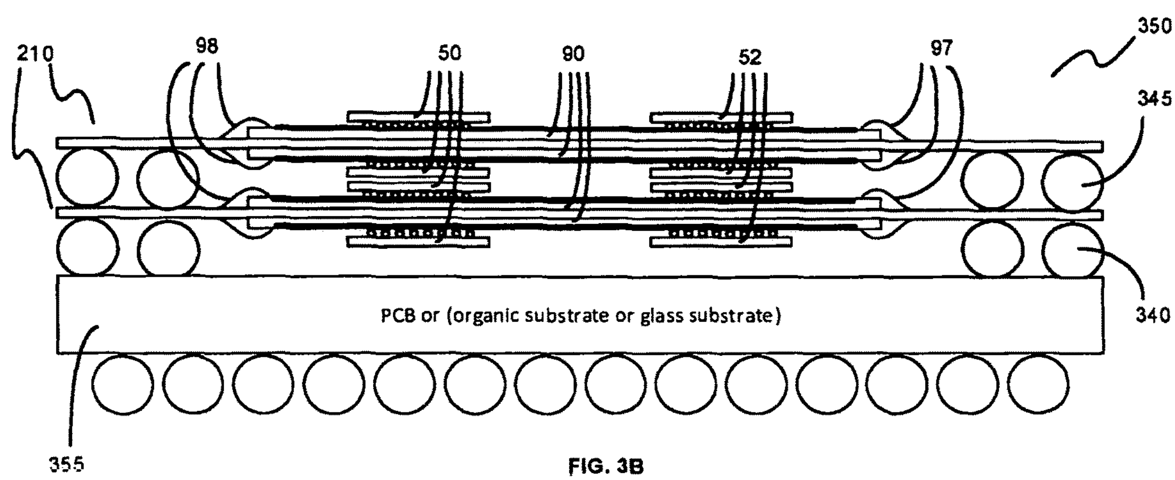
FIG. 3B is a side view of an assembly, in accordance with one exemplary embodiment of the present invention.

FIG. 3B is a cross-section view of stacking or interposers, using larger BGA ball sizes, in accordance with an exemplary embodiment. An assembly 350 comprises stacked assemblies according to assembly 210. BGAs 340 and 345 provide clearance for the stacked assemblies between one another and substrate 355. BGAs 340 and 345 have a larger ball size and pitch, appropriate for providing enough clearance so that devices of the assemblies fit and function properly.

Figure 3C:
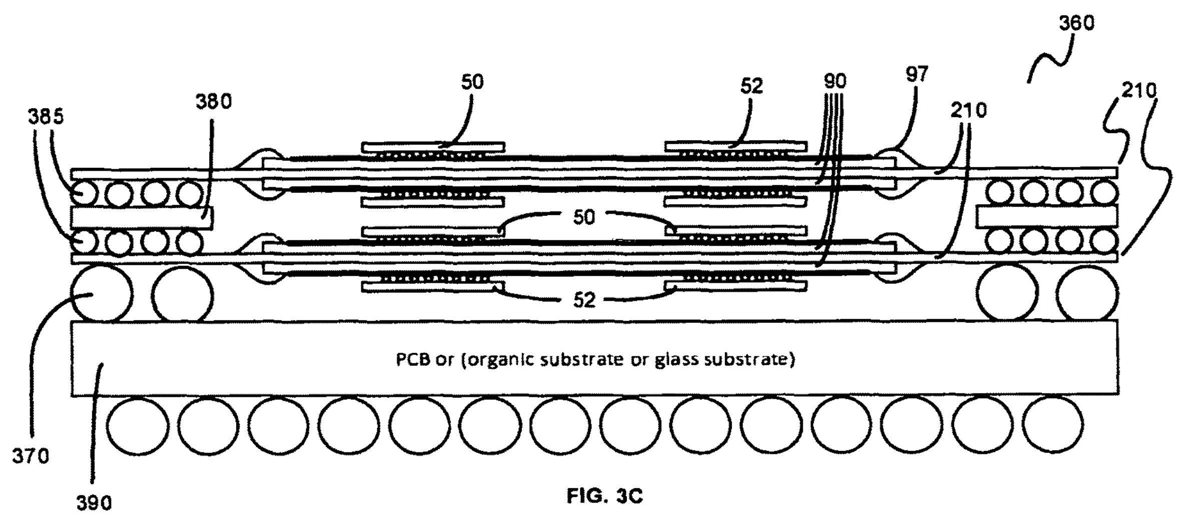
FIG. 3C is a side view of an assembly, in accordance with one exemplary embodiment of the present invention.

FIG. 3C is a cross-section view of stacking of interposers, using smaller BGA ball sizes, in accordance with an exemplary embodiment. An assembly 360 comprises stacked assemblies according to assembly 210. The two assemblies are shown as separated by a thin side-substrate 380 and BGAs having smaller ball size and pitch. Larger BGA 370 provides clearance from substrate 390.

Figure 4:
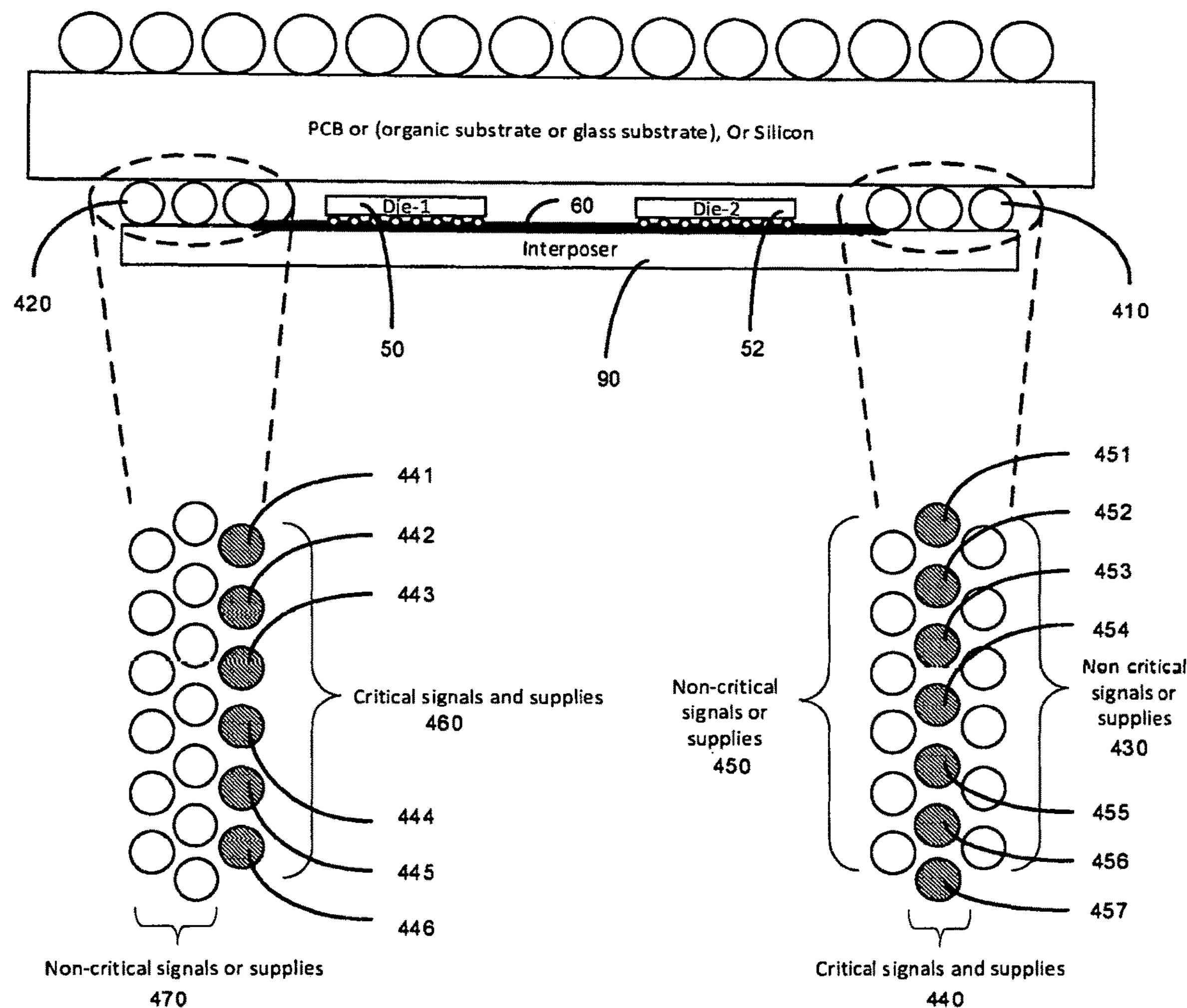
FIG. 4 illustrates arrangements of bump patterns used to create secured routing in accordance with an exemplary embodiment.

FIG. 4 illustrates arrangements of bump patterns used to mask critical signals and/or supplies in accordance with an exemplary embodiment. Bump pattern 420 includes in part critical signals or supplies 460 and non-critical signals or supplies 470. According to one embodiment of the invention, critical signal/supply bumps 460 or traces may be shielded against probing or tampering by placing the critical signal or supply bumps on an inner most line of bumps, namely bumps 441-446 while the non-critical signals or supplies 470 are placed on an outer most line of bumps. Similarly, bump pattern 410 includes in part critical signals or supplies 440, and non-critical signals or supplies 430, 450. Similarly, signals 451-457 are shielded from probing or tampering by placing these signals on innermost line of the bumps. In another embodiment of this invention, critical signals or supplies 440 may be positioned on a line of bumps between the non-critical signals or supplies 430 and 450.

Figure 5A:
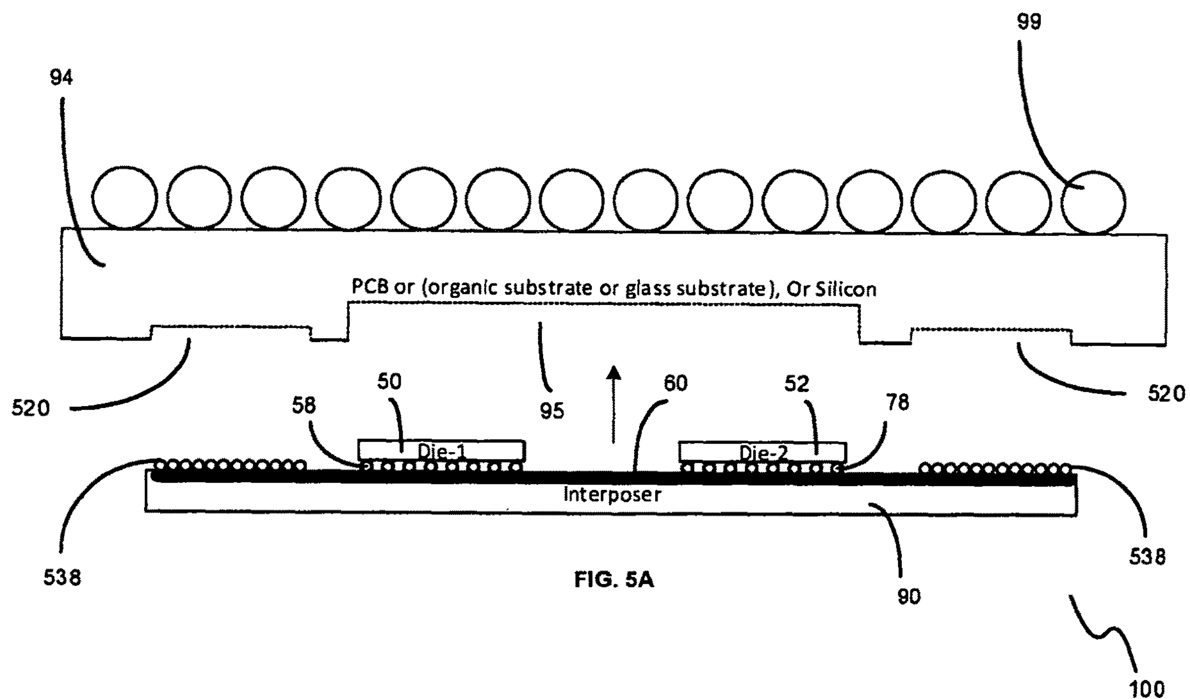
FIG. 5A is a side view of an assembly, in accordance with one exemplary embodiment of the present invention.
Figure 5B:
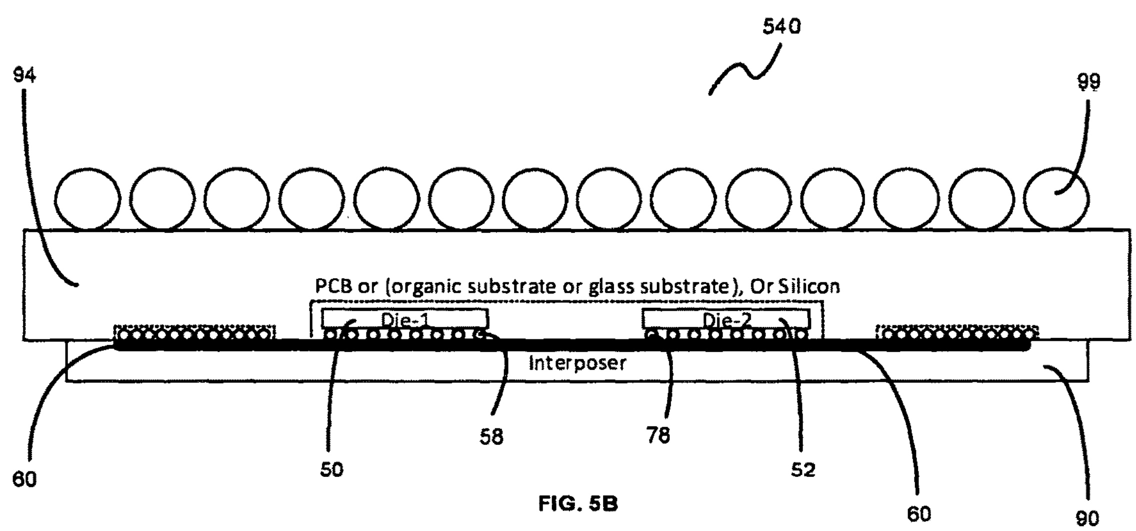
FIG. 5B is a side view of an assembly, in accordance with one exemplary embodiment of the present invention.
Figure 6A:
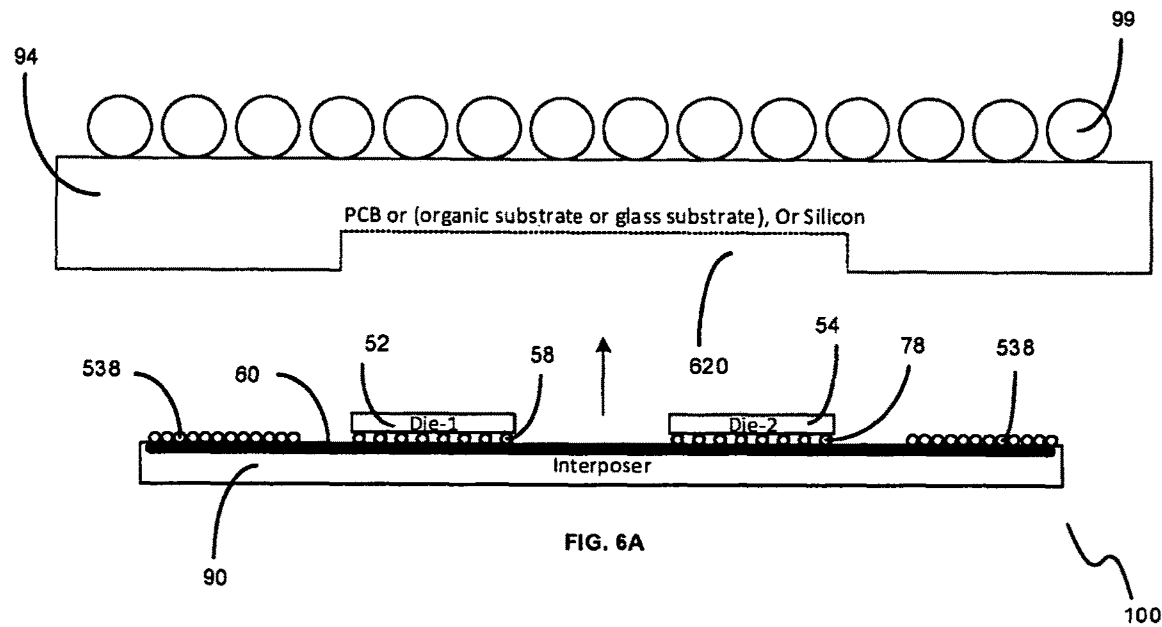
FIGS. 6A and 6B are side views of an assembly, in accordance with one exemplary embodiment of the present invention.
Figure 6B:
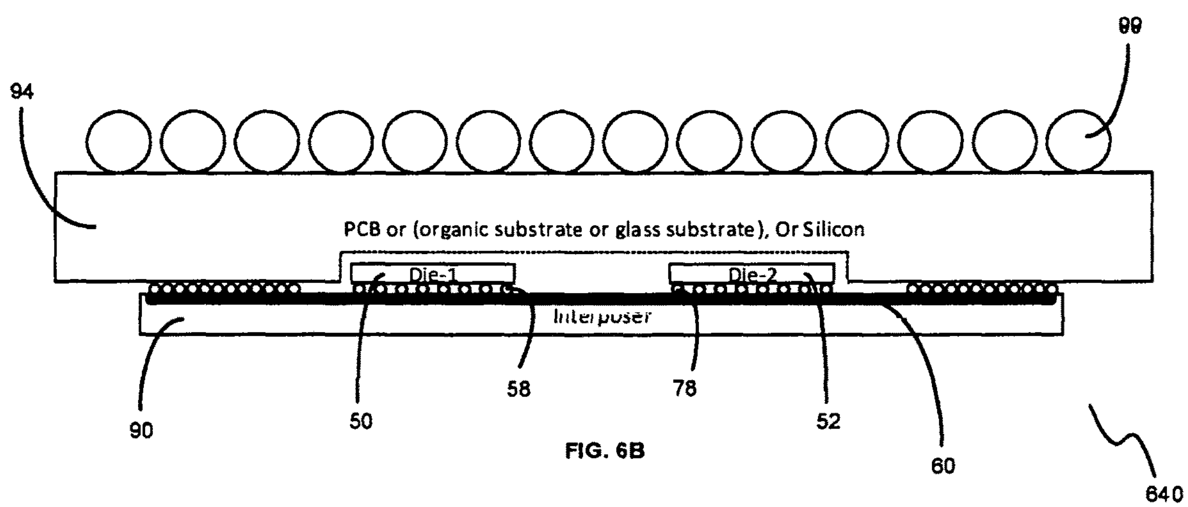
Figure 7:
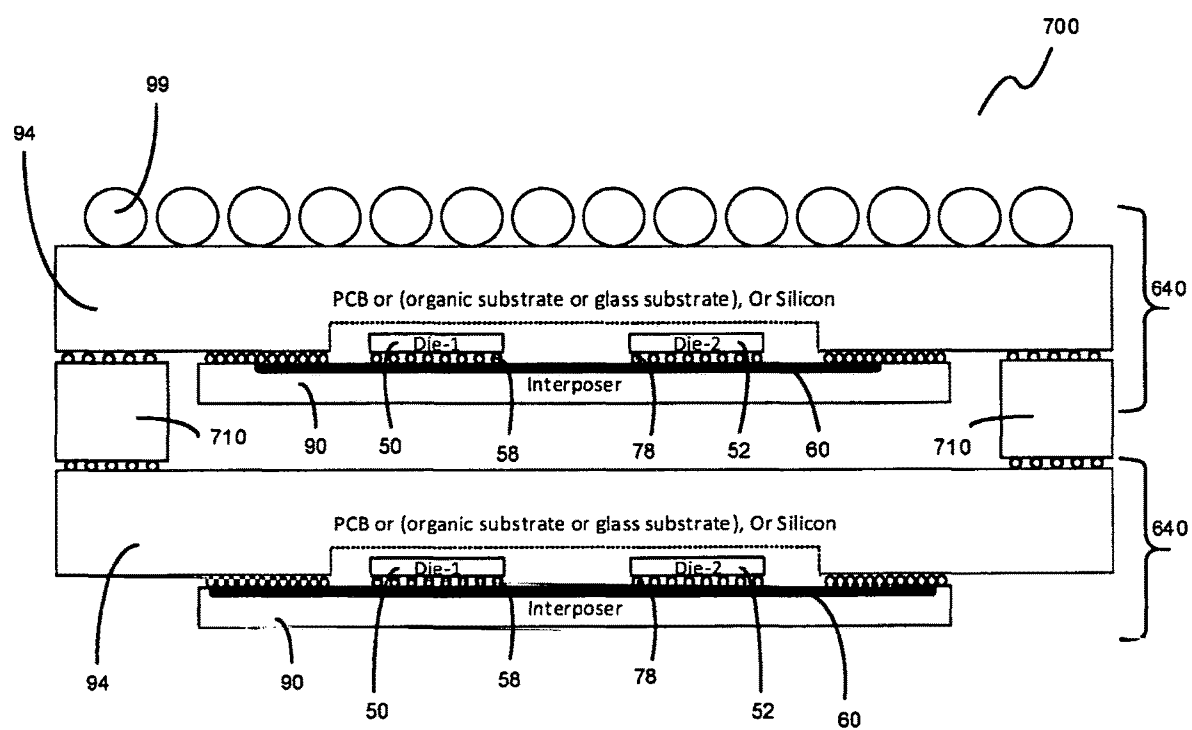
FIG. 7 is a side view of an assembly, in accordance with one exemplary embodiment of the present invention.

FIG. 5A is an exemplary embodiment of an assembly in accordance with another exemplary embodiment of the present invention. Substrate 94 is adapted to have a cavity 95 adapted to receive assembly 100 (See FIG. 1E) and cavities 520 disposed either along the periphery or opposite edges of substrate 94 to receive bumps 538 also formed on assembly 538. Since bumps 58, 78, and 538 are fully embedded within the walls of substrate 94, the signals used by devices 50 and 52 are shielded from tampering. FIG. 5B shows various components of FIG. 5A after they have been assembled together to form assembly 540. FIGS. 6A and 6B are respectively similar to FIGS. 5A and 5B except that in FIGS. 6A and 6B, bumps 538 are not placed in a cavity. FIG. 7 shows two assemblies 640 (see FIG. 6B) that are stacked together but separated via substrate 710.

Figure 8A:
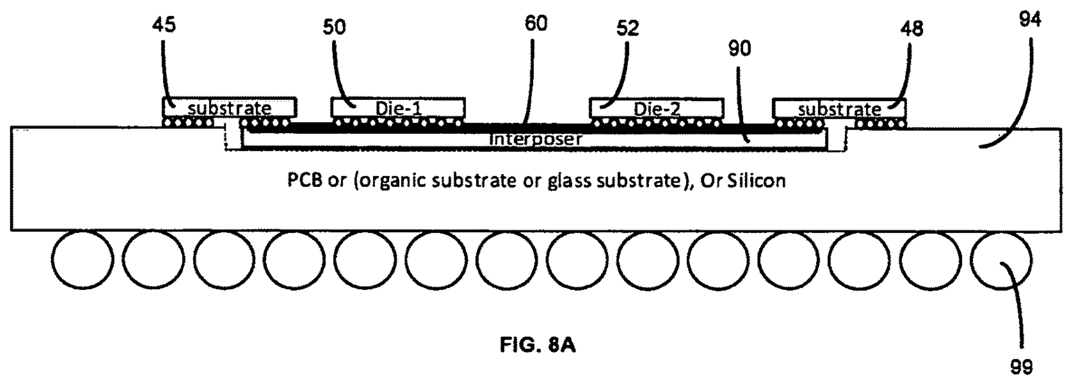
FIG. 8A is a side view of an assembly, in accordance with one exemplary embodiment of the present invention.
Figure 8B:
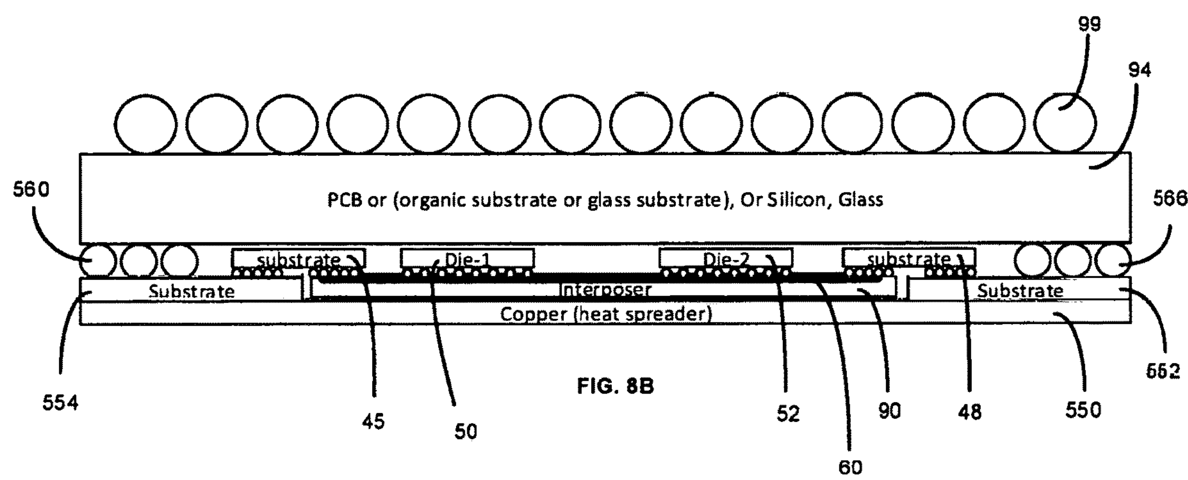
FIG. 8B is a side view of an assembly, in accordance with one exemplary embodiment of the present invention.
Figure 9:
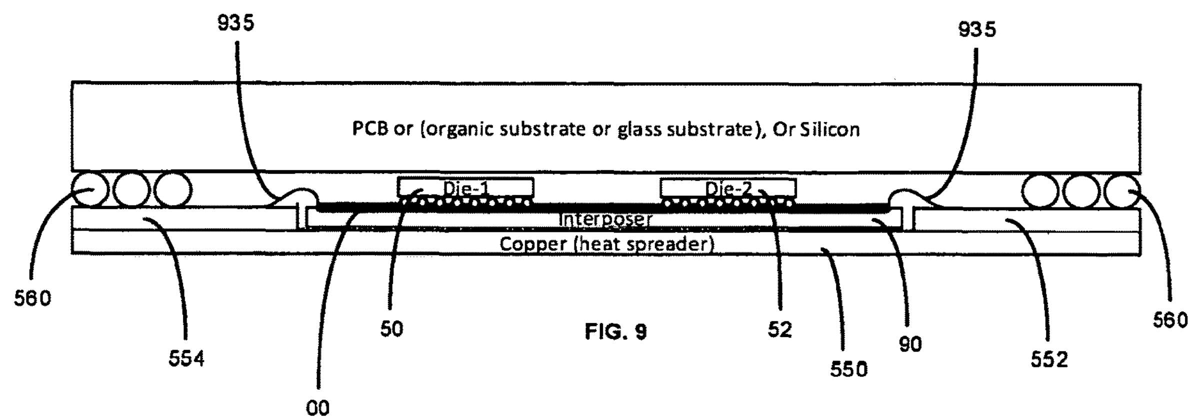
FIG. 9 is a side view of an assembly, in accordance with one exemplary embodiment of the present invention.

The assembly shown in FIG. 8B is similar to that shown in FIG. 8A except that in the assembly of FIG. 8B, semiconductor devices 50, 52, interposer 90, and a portion of each of substrates 45, 48 is disposed on a copper layer 550. The remaining portions of substrates 45 and 48 are disposed on substrates 552 and 554. Substrate 94 is disposed above devices 50, 52 and substrates 45, 48. Bumps 560 are used to transfer signals to or from devices 50, 52 to bumps 99 for communication with devices external to the assembly. It is understood that transfer of signals between bumps 560 and 99 is facilitated through signal traces formed in PCB or substrate 94 using vias, and the like. The assembly of FIG. 9 is similar to that shown in FIG. 8B except that in FIG. 9 wirebonds 935 are used to transfer signals between various metal layers disposed in interposer 90 and bumps 560.

Figure 10A:
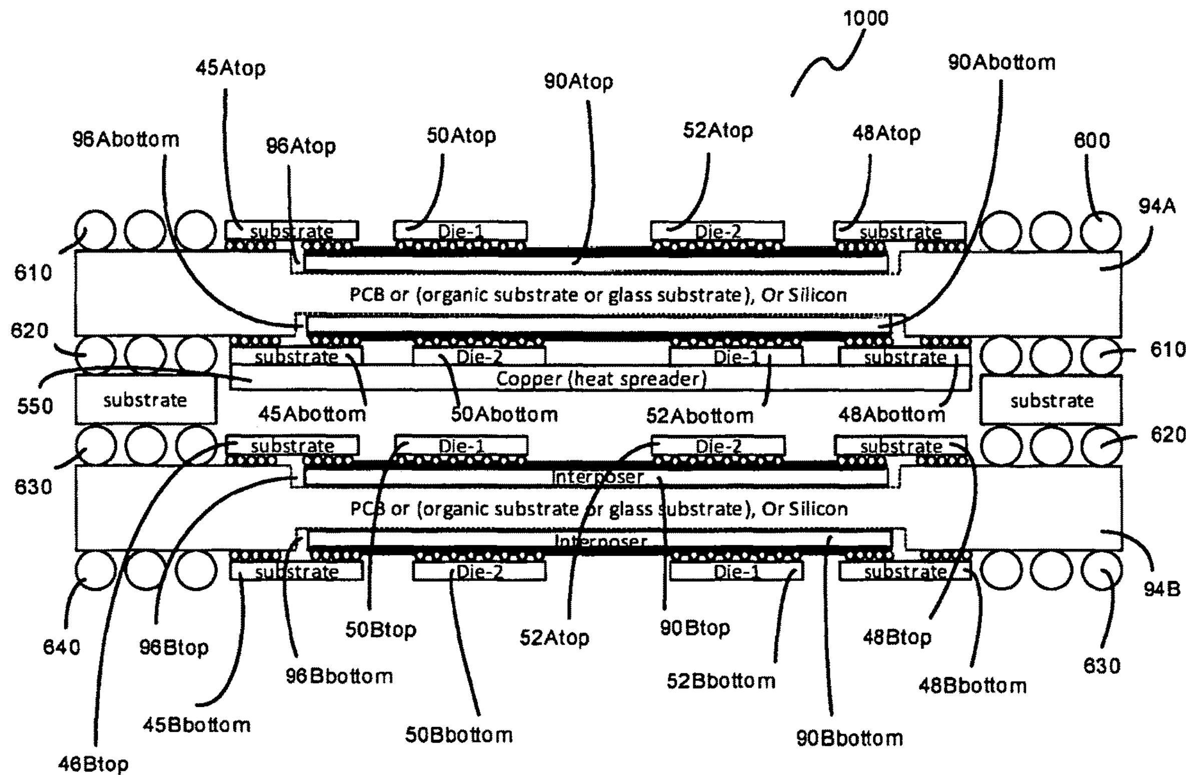
FIG. 10A is a side view of an assembly, in accordance with one exemplary embodiment of the present invention.

FIG. 10A is an exemplary embodiment of an assembly 1000, in accordance with another embodiment of the present invention. Assembly 1000 includes, in part, a pair of substrates 94A and 94B (each corresponding to substrate 90 as described above). Each substrate has a cavity formed on its top and bottom surfaces. For example, substrate 90A is shown as including a cavity 96$A_{top}$ formed on its top surface and a cavity 96$A_{bottom}$ formed on its bottom surface. Likewise, substrate 90B is shown as including a cavity 96$B_{top}$ formed on its top surface and a cavity 96$B_{bottom}$ formed on its bottom surface. Interposer 90$A_{top}$ has devices 50$A_{top}$, 52$A_{top}$ as well as substrates 45$A_{top}$, 48$A_{top}$ disposed thereon. Interposer 90$A_{bottom}$ has devices 50$A_{bottom}$, 52$A_{bottom}$ as well as substrates 45$A_{bottom}$, 48$A_{bottom}$ disposed thereon. Interposers 90$B_{top}$ and 90$B_{bottom}$ have similar devices and substrates thereon as shown. Bumps 610, 620, 630 and 640 together with substrates 45$A_{top}$, 48$A_{top}$ 45$A_{bottom}$, 48$A_{bottom}$ are used to facilitate signal transfer between the devices shown as well as devices external to assembly 1000. In FIG. 10, a copper heat spreader is disposed below substrates 45$A_{bottom}$, 48$A_{bottom}$ and devices 50$A_{bottom}$ and 52$A_{bottom}$. It is understood however, that a copper hear spreader may be disposed in other layers.

Figure 10B:
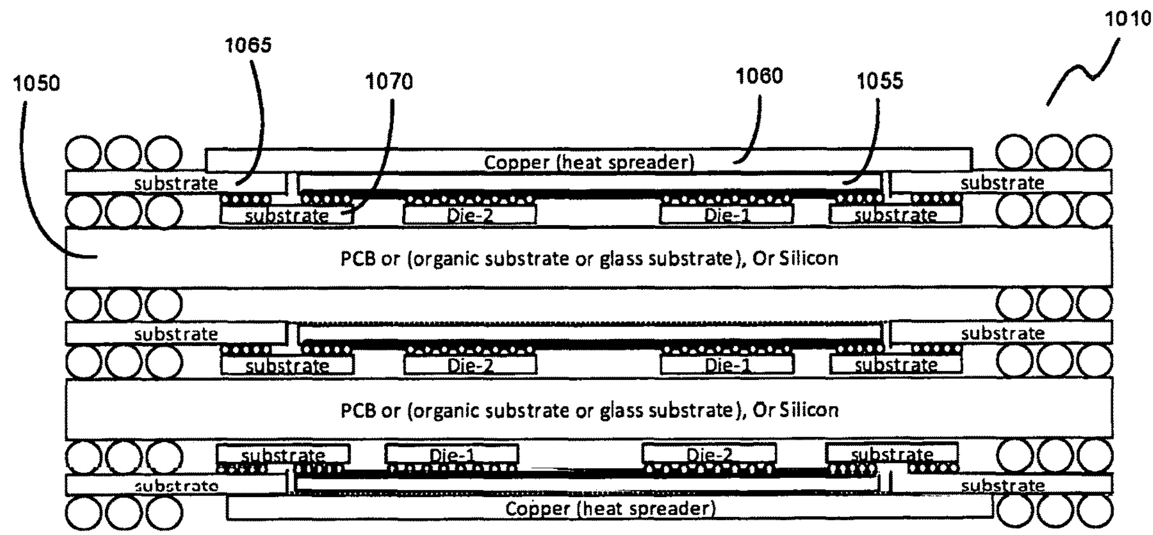
FIG. 10B is a side view of an assembly, in accordance with one exemplary embodiment of the present invention.

FIG. 10B illustrates stacking and scaling up low profile thermally enhanced and secured interconnects in accordance with an exemplary embodiment. In this example, there are no cavities in the substrate 1050, instead an interposer 1055 is attached to a copper heat spreader 1060 which is attached to side substrate 1065. It is understood that interposer 1055 does not have any TSVs. A secondary flip chip substrate 1070 is used to route the signals and supplies from the interposer 1055 the side-substrate 1065. In another embodiment, wirebonds are used to connect the interposer 1055 to the side-substrate 1065 instead of secondary flip chip substrates 1070.

Figure 11:
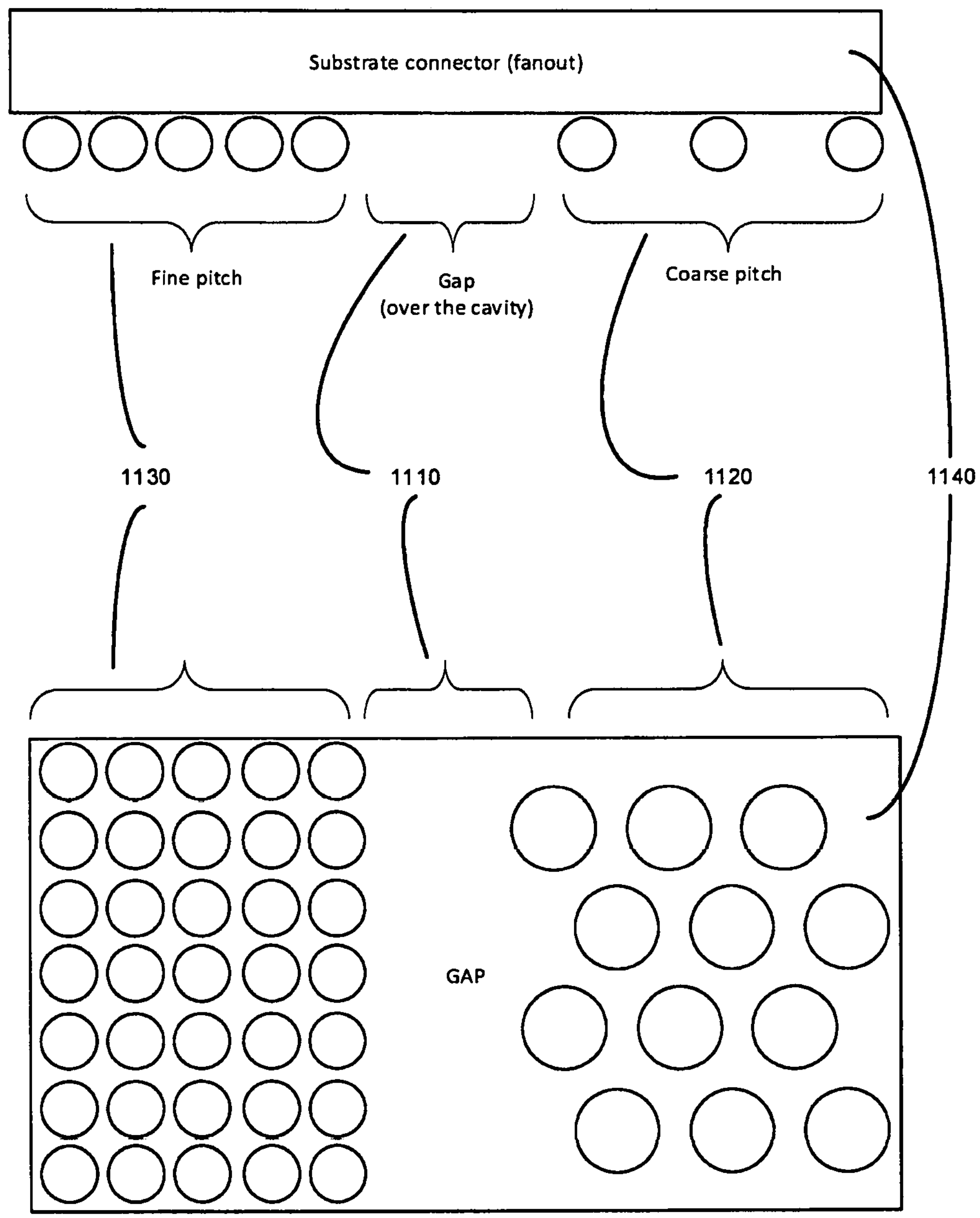
FIG. 11 is a cross-section of a substrate connector used to route signals and supplies over a cavity in accordance with an exemplary embodiment.

FIG. 11 is a cross-section of a substrate connector used to route signals and supplies over a cavity in accordance with an exemplary embodiment. Substrate connector 1140 includes an array of fine pitch bumps 1130 and an array of coarse pitch bumps 1120. A gap 1110 between the fine pitch bumps 1130 and the coarse pitch bumps 1120 provides a bridge for connecting over a cavity.

Figure 12:
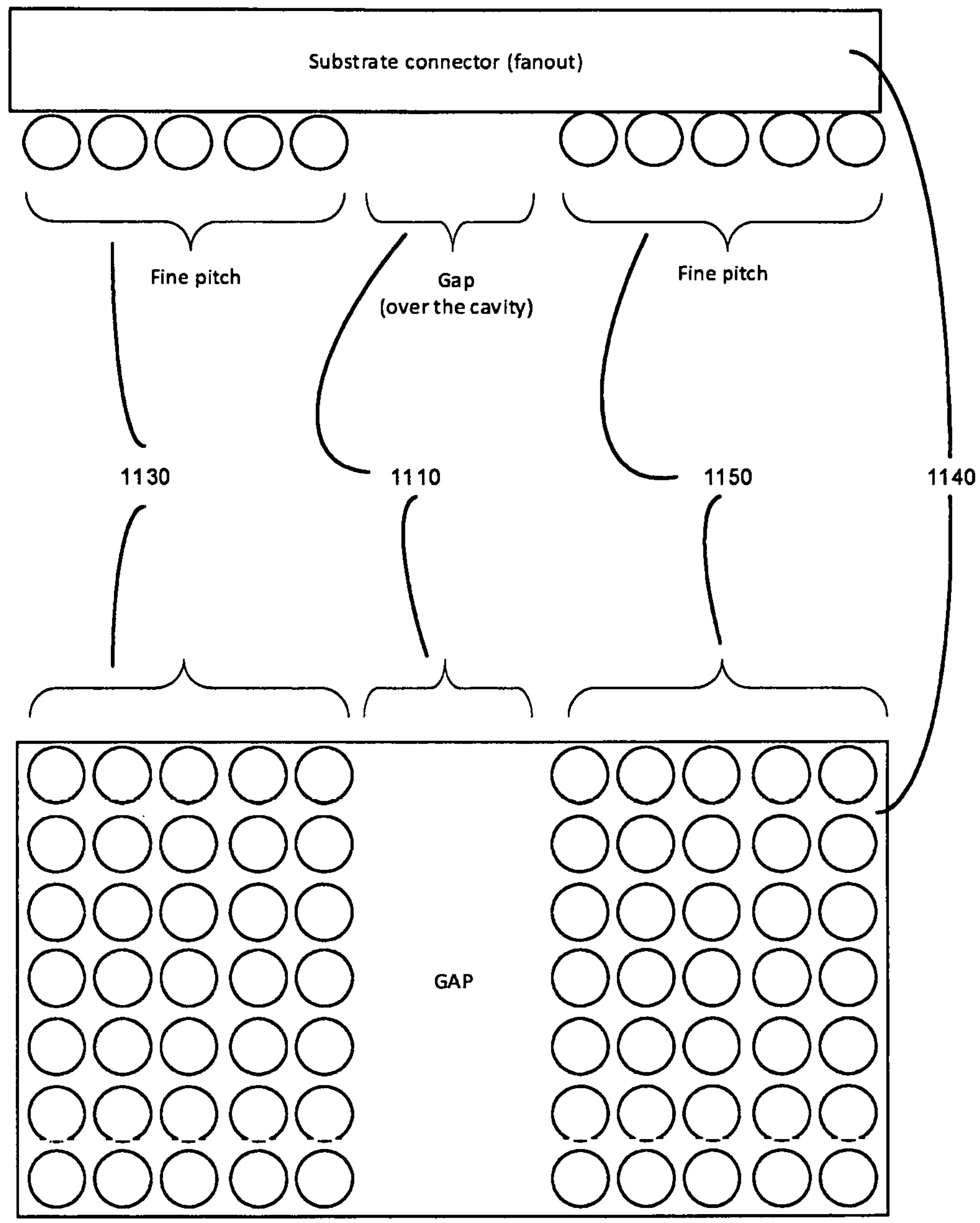
FIG. 12 is a cross-section of a substrate connector used to route signals and supplies over a cavity in accordance with an exemplary embodiment.

FIG. 12 is a cross-section of a substrate connector used to route signals and supplies over a cavity in accordance with an exemplary embodiment. Substrate connector 1140 includes a first array of fine pitch bumps 1130 and a second array of fine pitch bumps 1150. A gap 1110 between the first array of fine pitch bumps 1130 and the second array of fine pitch bumps 1150 provides a bridge for connecting over a cavity.

Figure 13A:
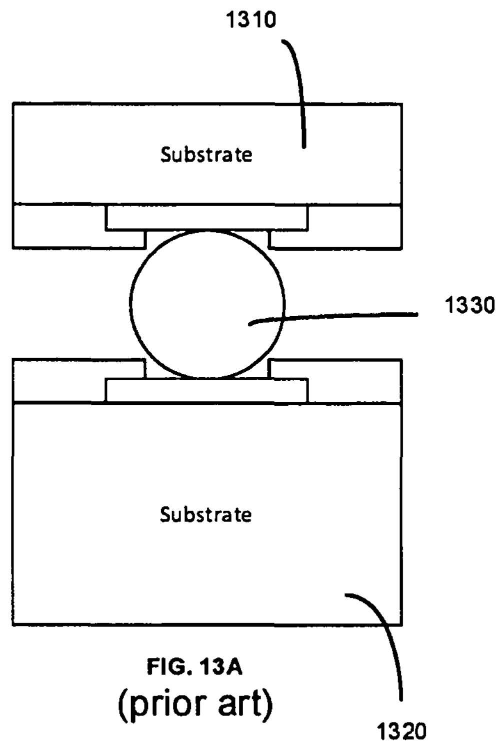
FIG. 13A is a bump joint assembly between two substrates according to prior art.
Figure 13B:
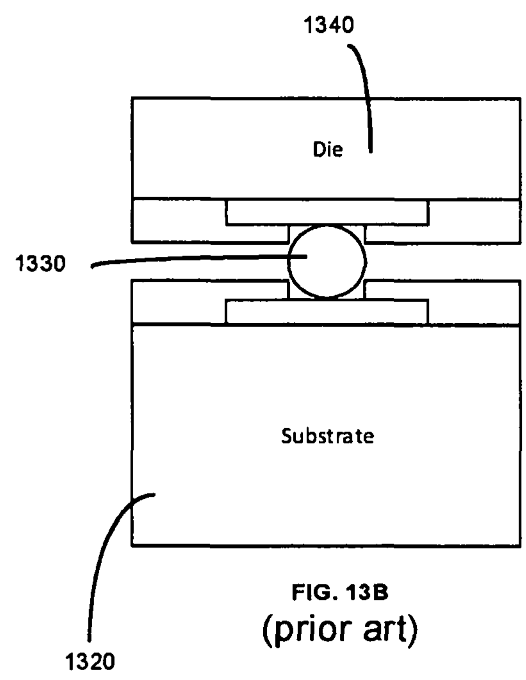
FIG. 13B is a bump joint assembly between a substrate and a die according to prior art.
Figure 13C:
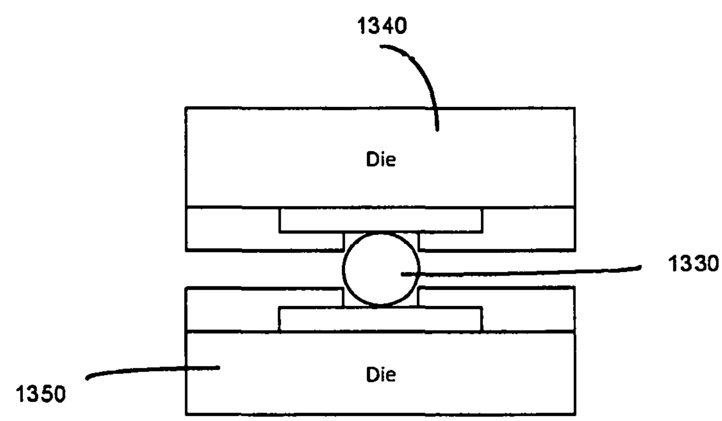
FIG. 13C is a bump joint assembly between two die according to prior art.

FIG. 13A is a bump joint assembly between two substrates according to prior art. Substrate 1320 and substrate 1310 are connected using bump 1330. FIG. 13B is a bump joint assembly between a substrate and a die according to prior art. Substrate 1320 and die 1340 are connected using bump 1330. FIG. 13C is a bump joint assembly between two die according to prior art. Die 1340 and die 1350 are connected using bump 1330.

Figure 14:
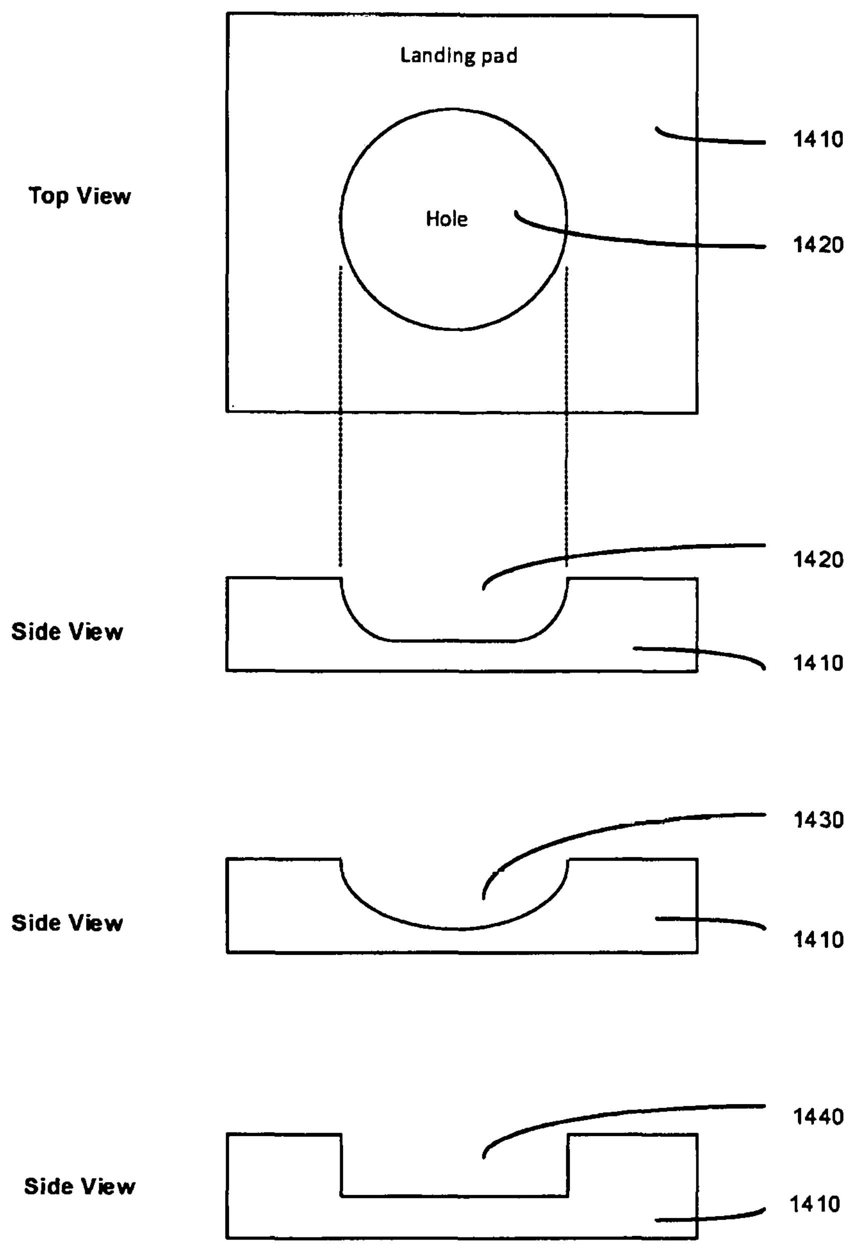
FIG. 14 is a top view of a landing pad used to connect components, and side view of a plurality of holes shape and depth used to enforce a connection between components in accordance with an exemplary embodiment.

FIG. 14 is a top view of a landing pad used to connect components, and side view of a plurality of holes shape and depth used to enforce a connection between components in accordance with an exemplary embodiment. Landing pad 1410 includes a hole 1420. Landing pad 1410 can also include a hole 1430 that has a different shape and depth than hole 1420. Similarly, landing pad 1410 can have a hole 1440 that has a different shape and depth than holes 1420 and 1430.

Figure 15A:
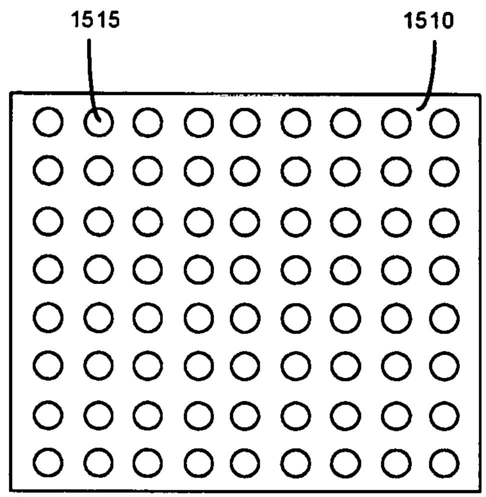
FIG. 15A is a top view of a plurality of holes with uniform pitch, shape and depth in accordance with an exemplary embodiment.

FIG. 15A is a top view of a plurality of holes with uniform pitch, shape and depth in accordance with an exemplary embodiment. Landing pad 1510 includes an array of holes 1515, each having the same pitch, shape, and depth.

Figure 15B:
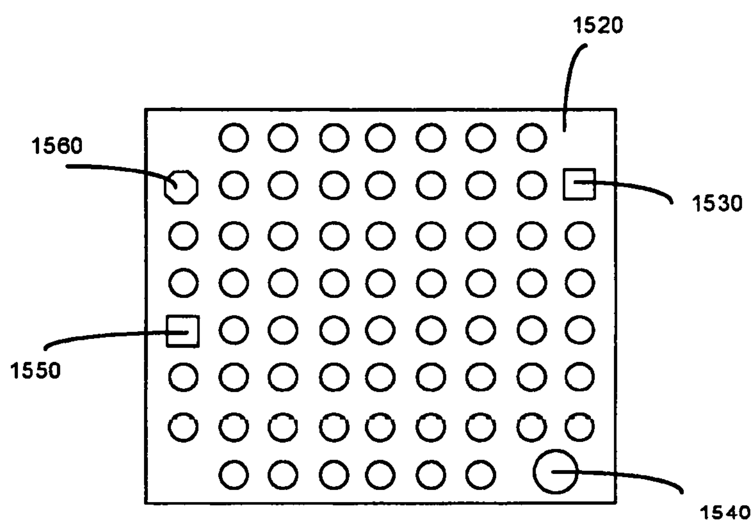
FIG. 15B is a top view of a plurality of holes with varying pitch, shape and depth in accordance with an exemplary embodiment.

FIG. 15B is a top view of a plurality of holes with varying pitch, shape and depth in accordance with an exemplary embodiment. Landing pad 1520 includes an array of holes, including holes 1530, 1540, 1550 and 1560 having varying pitch, shape, and depth.

Figure 16:
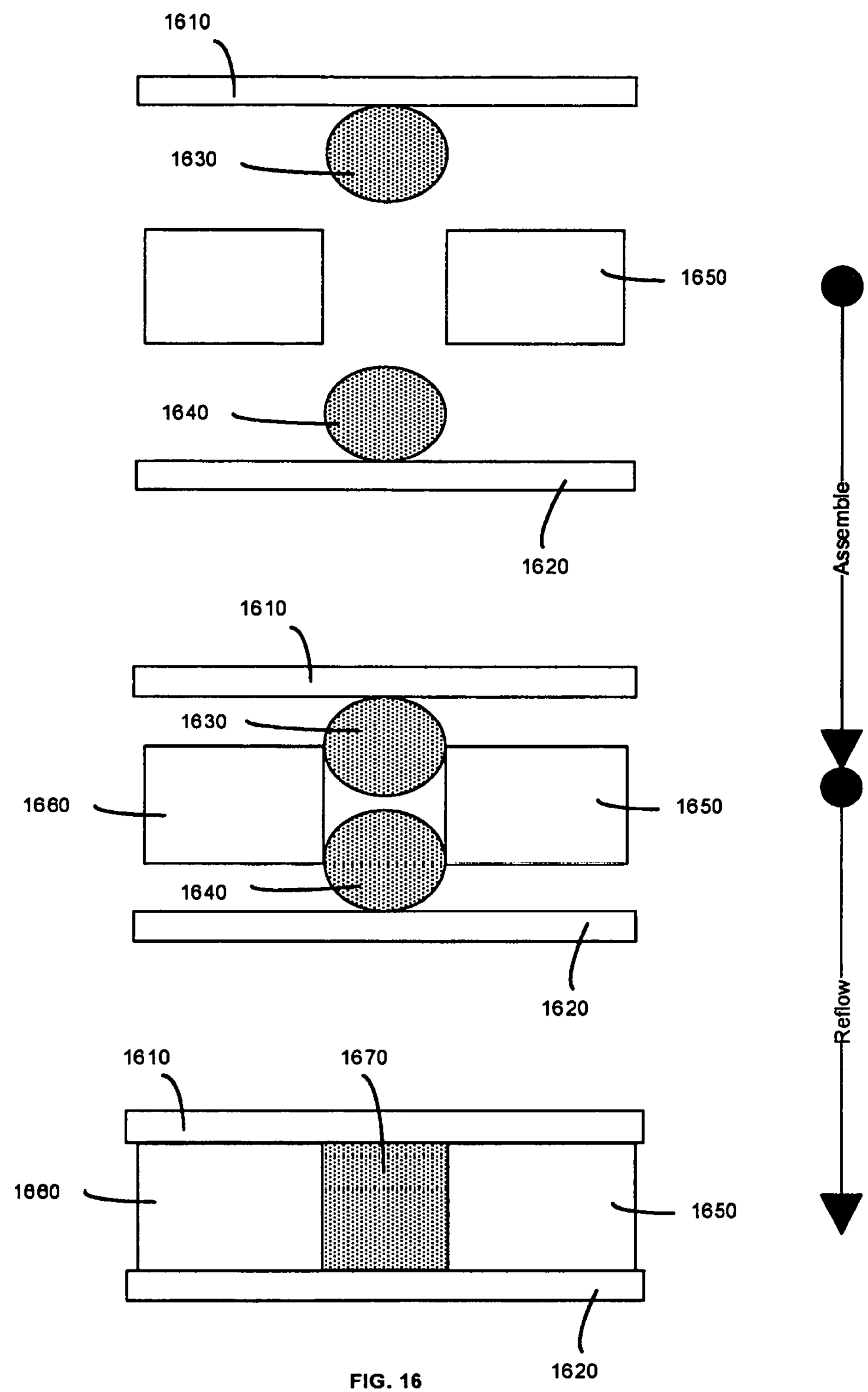
FIG. 16 illustrates an assembly process used to assemble mask defined components and substrates without using under bump metallization (UBM) in accordance with an exemplary embodiment.

FIG. 16 illustrates an assembly process used to assemble mask defined components and substrates without under bump metallization (UBM) in accordance with an exemplary embodiment. Components 1610 and 1620 are assembled using bumps 1630 and 1640 and spaced apart by spacers 1660. The bumps 1630 and 1640 are placed partially inside a through hole with proper depth. After process reflow, the bumps 1630 and 1640 are melted and joined together to form a connection 1670 between the components 1610 and 1620.

Figure 17:
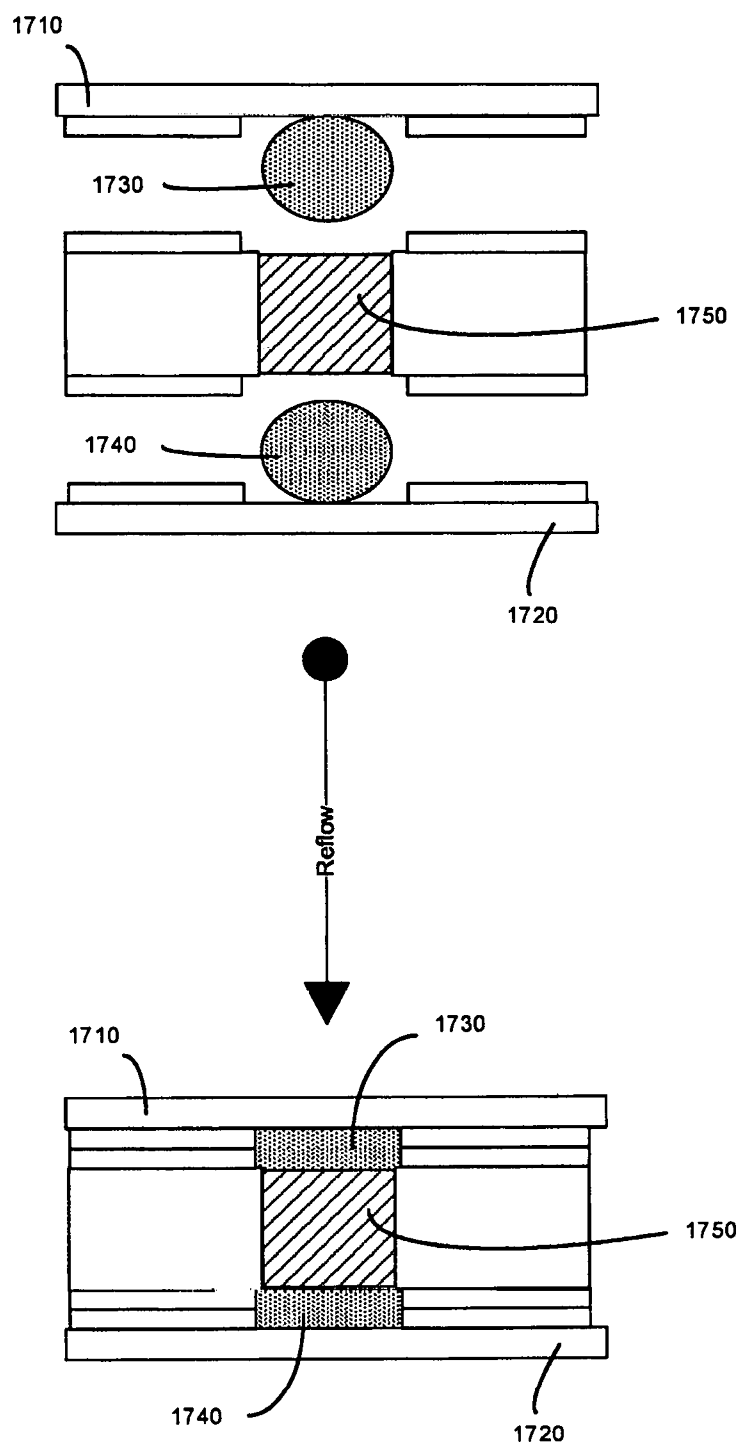
FIG. 17 illustrates an assembly process used to assemble mask defined components and substrates in accordance with an exemplary embodiment.

FIG. 17 illustrates an assembly process used to assemble mask defined components and substrates in accordance with an exemplary embodiment. Components 1710 and 1720 are assembled together using bumps 1730 and 1740. Conductive material 1750 partially fills a mask defined hole. After a reflow the bumps 1730 and 1740 are melted and joined together to form a connection between components 1710 and 1720.

Figure 18A:
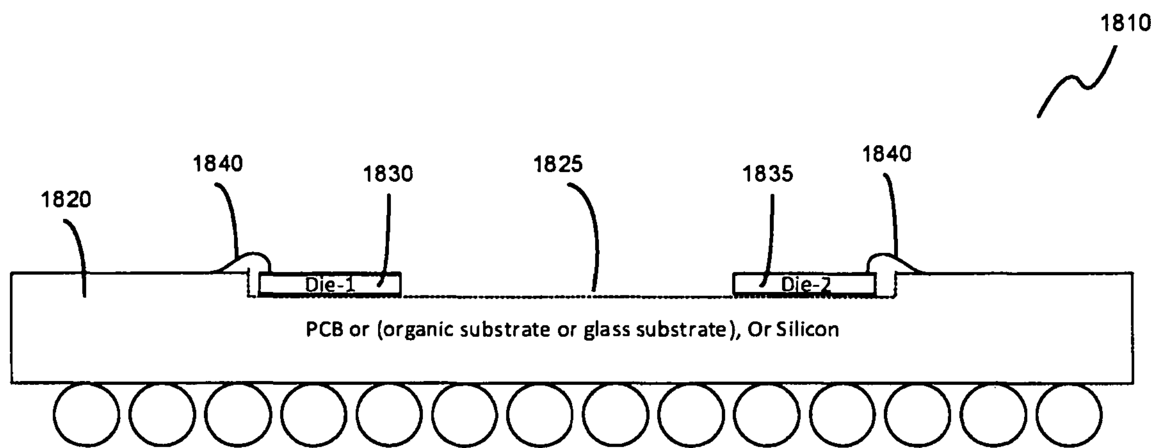
FIG. 18A illustrates a plurality of wirebonded dies placed inside a substrates cavity in accordance with an exemplary embodiment.

FIG. 18A illustrates a plurality of wirebonded dies placed inside a substrate cavity in accordance with an exemplary embodiment. Assembly 1810 includes a substrate 1820 with a cavity 1825 created therein. Devices 1830 and 1835 are wirebonded 1840 to substrate 1820.

Figure 18B:
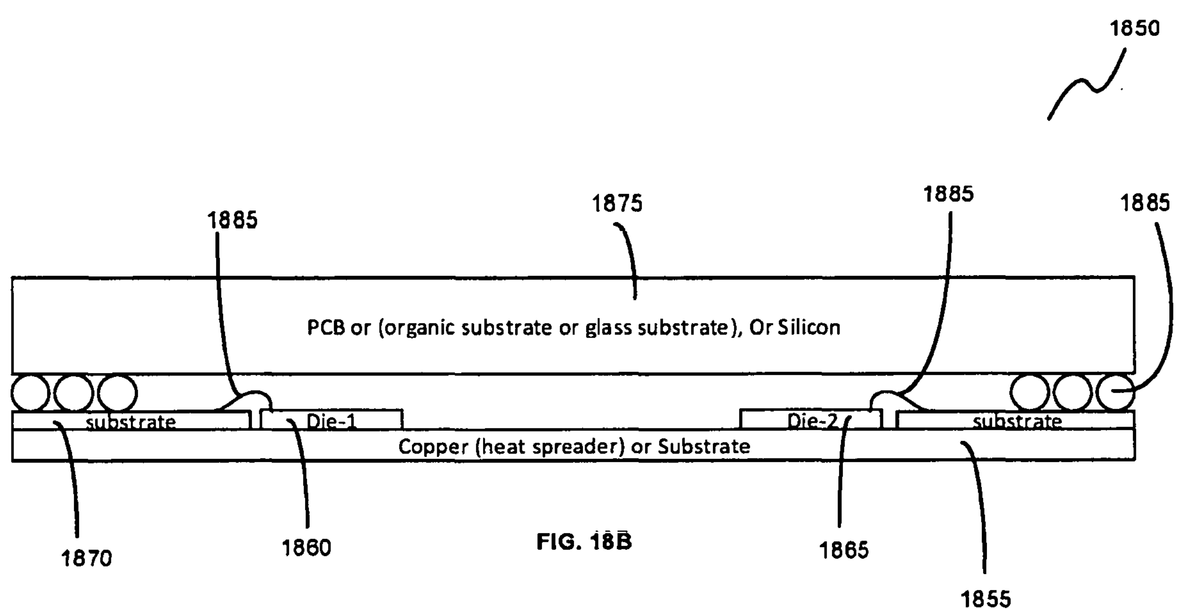
FIG. 18B illustrates a plurality of wirebonded dies placed on a copper heat spreader in accordance with an exemplary embodiment.

FIG. 18B illustrates a plurality of wirebonded dies placed on a copper heat spreader in accordance with an exemplary embodiment. In assembly 1850, devices 1860 and 1865 are placed on a copper heat spreader 1855 (or substrate) and wirebonded 1885 to substrate 1870. A substrate 1875 is assembled to substrate 1870 using bumps 1880.

Figure 19A:
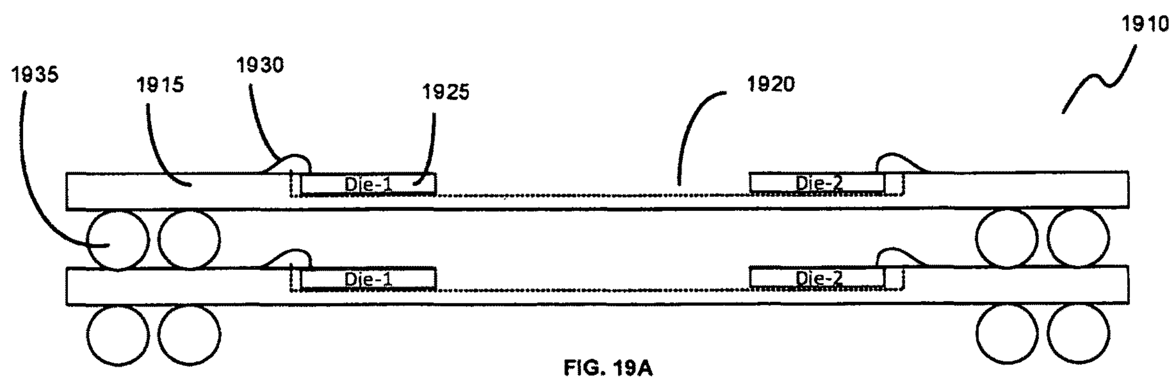
FIG. 19A illustrates a plurality of wirebonded dies placed side by side inside a substrate's cavity in accordance with an exemplary embodiment.

FIG. 19A illustrates a plurality of wirebonded dies placed side by side inside a substrate cavity in accordance with an exemplary embodiment. Assembly 1910 includes a stack of assemblies having a substrate 1915 with a cavity 1920 created therein. Multiple devices 1925 can be placed in the cavity 1920 and wirebonded 1930 to the substrate 1915. Assemblies are stacked and separated using bumps 1935.

Figure 19B:
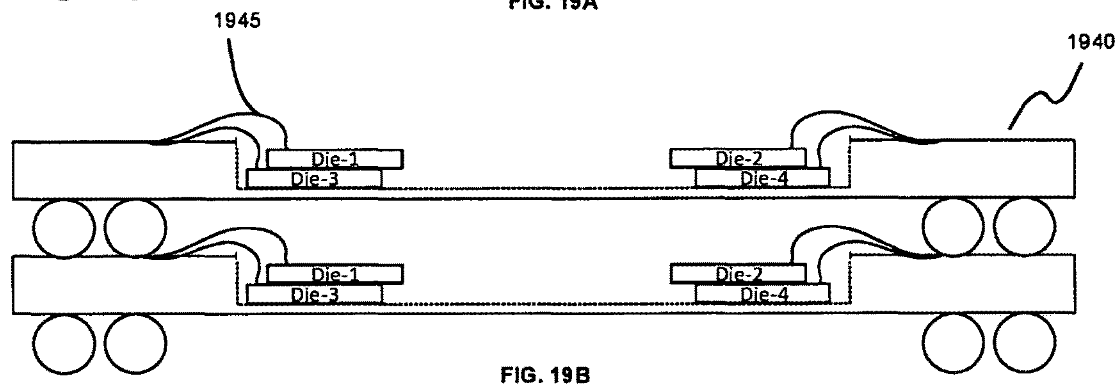
FIG. 19B illustrates a plurality of wirebonded dies placed inside a substrate's cavity side by side and on top of each other in accordance with an exemplary embodiment.

FIG. 19B illustrates a plurality of wirebonded dies placed inside a substrate cavity side by side and on top of each other in accordance with an exemplary embodiment. Assembly 1940 is similar to assembly 1910, except multiple devices 1945 are placed on top of one another within the substrate cavity.

Figure 19C:
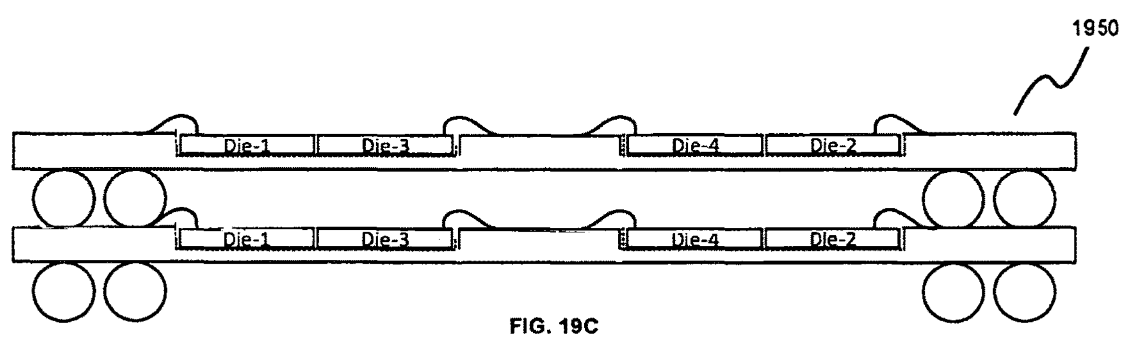
FIG. 19C illustrates a plurality of wirebonded dies placed side by side inside substrate cavities in accordance with an exemplary embodiment.

FIG. 19C illustrates a plurality of wirebonded dies placed side by side inside substrate cavities in accordance with an exemplary embodiment. Assembly 1950 comprises multiple stacked assemblies, each including a substrate having multiple cavities created therein. Devices are placed side by side within the cavities and are wirebonded to the substrate.

Figure 19D:
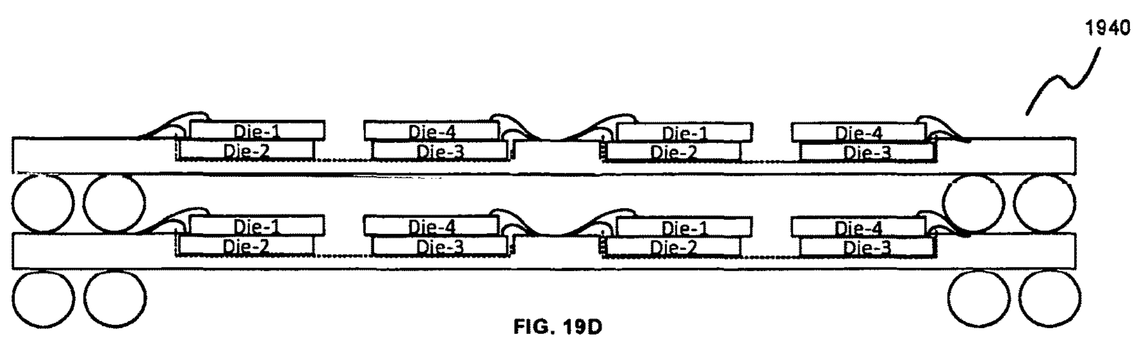
FIG. 19D illustrates a plurality of wirebonded dies placed side by side and on top of each other inside substrate cavities in accordance with an exemplary embodiment.

FIG. 19D illustrates a plurality of wirebonded dies placed side by side and on top of each other inside substrate cavities in accordance with an exemplary embodiment. Assembly 1960 comprises multiple stacked assemblies and is similar to assembly 1950 except multiple devices are placed on top of one another within the substrate cavities.

It is also understood that the examples and embodiments described herein are for illustrative purposes only and that various modifications or changes in light thereof will be suggested to persons skilled in the art and are to be included within the spirit and purview of this application and scope of the appended claims.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the embodiments described herein. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the embodiments described, subject to any specifically excluded limit in the stated range. Where the stated range includes one or both of the limits, ranges excluding either or both of those included limits are also included.

As used herein and in the appended claims, the singular forms “a”, “an”, and “the” include plural referents unless the context clearly dictates otherwise. Thus, for example, reference to “a process” includes a plurality of such processes and reference to “the dielectric material” includes reference to one or more dielectric materials and equivalents thereof known to those skilled in the art, and so forth.

Also, the words “comprise,” “comprising,” “include,” “including,” and “includes” when used in this specification and in the following claims are intended to specify the presence of stated features, integers, components, or steps, but they do not preclude the presence or addition of one or more other features, integers, components, steps, acts, or groups.

What is claimed is:

1. An integrated circuit package comprising:
a first substrate having a cavity/clearance, wherein
said cavity/clearance is formed using two opposite side walls of the first substrate, and
said two opposite sides of the cavity/clearance are open;
a second substrate; and
one or more component(s) is/are coupled to the second substrate, wherein
said second substrate is located inside the cavity/clearance of the first substrate,
said second substrate is a passive substrate and not an active chip, and
said cavity/clearance is formed using two standoff substrates coupled to the first substrate while the two opposite sides of the cavity/clearance are open.

2. The integrated circuit package according to claim 1, wherein
said first substrate and said second substrate are electrically coupled using wire and/or redistribution layer.

3. The integrated circuit package according to claim 1, wherein
said cavity/clearance is formed along the periphery of the first substrate.

4. The integrated circuit package according to claim 1, wherein
at least one of said one or more component(s) is/are electrically coupled to the first substrate and/or second substrate.

5. The integrated circuit package according to claim 1, wherein
at least one of said one or more component(s) is/are electrically coupled to the first substrate using a flip chip or a wirebond method.

6. The integrated circuit package according to claim 1, wherein
said cavity/clearance contains active and/or passive component(s).

7. The integrated circuit package according to claim 1, wherein
said first substrate and/or said second substrate contains one or more through holes and/or cavities.

8. The integrated circuit package according to claim 1, wherein
at least one substrate of said first substrate and/or second substrate comprises of RDL and/or through substrate via.

9. The integrated circuit package according to claim 1, wherein
one of said one or more component(s) is/are an antenna or amplifier or capacitor or resistor or inductor or processor or memory or sensor or analog-to-digital converter or digital-to-analog converter or electrical-optical converter or optical-electrical converter or Light Emitting Diode (LED) or ASIC or TSV or laser or FPGA or analog circuit or digital circuit or SerDes or filter or Lens or GPU or magnet or waveguide or wirebond or mold or under-fill or heat-pipe or mirror or fan or bump or fiber or accelerator or MEMS or membrane or heat spreader or RDL or energy source or light source or battery.

10. The integrated circuit package according to claim 1, wherein
at least one substrate of said first substrate and/or second substrate and at least one component of said one or more component(s) is/are manufactured as one piece.

11. A system comprising:
a first substrate having a cavity/clearance; wherein
said cavity/clearance is formed using two opposite side walls of the first substrate, and
two opposite sides of the cavity/clearance are open; and
a second substrate, wherein
said second substrate is located inside the cavity/clearance of the first substrate,
said second substrate is a passive substrate and not an active chip, and
said cavity/clearance is formed using two standoff substrates coupled to the first substrate while the two opposite sides of the cavity/clearance are open.

12. A system comprising:
a first substrate having a cavity/clearance, wherein
said cavity/clearance is formed using one wall of the first substrate, and
opposite sides of the cavity/clearance are open; and
a second substrate, wherein
said second substrate is located inside the cavity/clearance of the first substrate,
said second substrate is a passive substrate and not an active chip, and
said cavity/clearance is formed using two standoff substrates coupled to the first substrate while the two opposite sides of the cavity/clearance are open.

13. An integrated circuit package comprising:
a first substrate having a cavity/clearance, wherein
said cavity/clearance is formed using two opposite side walls of the first substrate, and
said two opposite sides of the cavity/clearance are open;
a second substrate; and
one or more component(s) is/are coupled to the second substrate, wherein said second substrate is located inside the cavity/clearance of the first substrate, said second substrate is a passive substrate and not an active chip, and said cavity/clearance is formed using two standoff substrates coupled to the first substrate while the two adjacent sides of the cavity/clearance are open.

14. A system comprising a first substrate having a cavity/clearance; wherein said cavity/clearance is formed using two opposite side walls of the first substrate, and two opposite sides of the cavity/clearance are open; and a second substrate, wherein said second substrate is located inside the cavity/clearance of the first substrate, said second substrate is a passive substrate and not an active chip, and said cavity/clearance is formed using two standoff substrates coupled to the first substrate while the two adjacent sides of the cavity/clearance are open.

15. A system comprising:

a first substrate having a cavity/clearance, wherein said cavity/clearance is formed using one wall of the first substrate, and opposite sides of the cavity/clearance are open; and a second substrate, wherein said second substrate is located inside the cavity/clearance of the first substrate, said second substrate is a passive substrate and not an active chip, and said cavity/clearance is formed using two standoff substrates coupled to the first substrate while the two adjacent sides of the cavity/clearance are open.

16. The integrated circuit package according to claim 11, wherein the at least one standoff substrate comprises of two or more substrates.

17. The integrated circuit package according to claim 11, wherein at least one active or passive component is coupled to at least one of the said first substrate and/or second substrate and/or standoff substrate.

18. The integrated circuit package according to claim 11, wherein said cavity/clearance contains active and/or passive component(s).

19. The integrated circuit package according to claim 11, wherein said first substrate and/or said second substrate contains one or more through holes and/or cavities.

20. The integrated circuit package according to claim 11, wherein at least one of said first substrate and/or second substrate and/or standoff substrate comprises of RDL and/or through substrate via.

21. The integrated circuit package according to claim 17, wherein one of the component(s) is/are an antenna or amplifier or capacitor or resistor or inductor or processor or memory or sensor or analog-to-digital converter or digital-to-analog converter or electrical-optical converter or optical-electrical converter or Light Emitting Diode (LED) or ASIC or TSV or laser or FPGA or analog circuit or digital circuit or SerDes or filter or Lens or GPU or magnet or waveguide or wirebond or mold or under-fill or heat-pipe or mirror or fan or bump or fiber or accelerator or MEMS or membrane or heat spreader or RDL or energy source or light source or battery.

22. The integrated circuit package according to claim 12, wherein the at least one standoff substrate comprises of two or more substrates.

23. The integrated circuit package according to claim 12, wherein at least one active or passive component is coupled to at least one of the said first substrate and/or second substrate and/or standoff substrate.

24. The integrated circuit package according to claim 12, wherein said cavity/clearance contains active and/or passive component(s).

25. The integrated circuit package according to claim 12, wherein said first substrate and/or said second substrate contains one or more through holes and/or cavities.

26. The integrated circuit package according to claim 12, wherein at least one of said first substrate and/or second substrate and/or standoff substrate comprises of RDL and/or through substrate via.

27. The integrated circuit package according to claim 23, wherein one of the component(s) is/are an antenna or amplifier or capacitor or resistor or inductor or processor or memory or sensor or analog-to-digital converter or digital-to-analog converter or electrical-optical converter or optical-electrical converter or Light Emitting Diode (LED) or ASIC or TSV or laser or FPGA or analog circuit or digital circuit or SerDes or filter or Lens or GPU or magnet or waveguide or wirebond or mold or under-fill or heat-pipe or mirror or fan or bump or fiber or accelerator or MEMS or membrane or heat spreader or RDL or energy source or light source or battery.

28. The integrated circuit package according to claim 13, wherein the at least one standoff substrate comprises of two or more substrates.

29. The integrated circuit package according to claim 13, wherein at least one active or passive component is coupled to at least one of the said first substrate and/or second substrate and/or standoff substrate.

30. The integrated circuit package according to claim 13, wherein said cavity/clearance contains active and/or passive component(s).

31. The integrated circuit package according to claim 13, wherein said first substrate and/or said second substrate contains one or more through holes and/or cavities.

32. The integrated circuit package according to claim 13, wherein at least one of said first substrate and/or second substrate and/or standoff substrate comprises of RDL and/or through substrate via.

33. The integrated circuit package according to claim 29, wherein one of the component(s) is/are an antenna or amplifier or capacitor or resistor or inductor or processor or memory or sensor or analog-to-digital converter or digital-to-analog converter or electrical-optical converter or optical-electrical converter or Light Emitting Diode (LED) or ASIC or TSV or laser or FPGA or analog circuit or digital circuit or SerDes or filter or Lens or GPU or magnet or waveguide or wirebond or mold or under-fill or heat-pipe or mirror or fan or bump or fiber or accelerator or MEMS or membrane or heat spreader or RDL or energy source or light source or battery.

34. The integrated circuit package according to claim 14, wherein the at least one standoff substrate comprises of two or more substrates.

35. The integrated circuit package according to claim 14, wherein at least one active or passive component is coupled to at least one of the said first substrate and/or second substrate and/or standoff substrate.

36. The integrated circuit package according to claim 14, wherein said cavity/clearance contains active and/or passive component(s).

37. The integrated circuit package according to claim 14, wherein said first substrate and/or said second substrate contains one or more through holes and/or cavities.

38. The integrated circuit package according to claim 14, wherein at least one of said first substrate and/or second substrate and/or standoff substrate comprises of RDL and/or through substrate via.

39. The integrated circuit package according to claim 35, wherein one of the component(s) is/are an antenna or amplifier or capacitor or resistor or inductor or processor or memory or sensor or analog-to-digital converter or digital-to-analog converter or electrical-optical converter or optical-electrical converter or Light Emitting Diode (LED) or ASIC or TSV or laser or FPGA or analog circuit or digital circuit or SerDes or filter or Lens or GPU or magnet or waveguide or wirebond or mold or under-fill or heat-pipe or mirror or fan or bump or fiber or accelerator or MEMS or membrane or heat spreader or RDL or energy source or light source or battery.

40. The integrated circuit package according to claim 15, wherein the at least one standoff substrate comprises of two or more substrates.

41. The integrated circuit package according to claim 15, wherein at least one active or passive component is coupled to at least one of the said first substrate and/or second substrate and/or standoff substrate.

42. The integrated circuit package according to claim 15, wherein said cavity/clearance contains active and/or passive component(s).

43. The integrated circuit package according to claim 15, wherein said first substrate and/or said second substrate contains one or more through holes and/or cavities.

44. The integrated circuit package according to claim 15, wherein at least one of said first substrate and/or second substrate and/or standoff substrate comprises of RDL and/or through substrate via.

45. The integrated circuit package according to claim 41, wherein one of the component(s) is/are an antenna or amplifier or capacitor or resistor or inductor or processor or memory or sensor or analog-to-digital converter or digital-to-analog converter or electrical-optical converter or optical-electrical converter or Light Emitting Diode (LED) or ASIC or TSV or laser or FPGA or analog circuit or digital circuit or SerDes or filter or Lens or GPU or magnet or waveguide or wirebond or mold or under-fill or heat-pipe or mirror or fan or bump or fiber or accelerator or MEMS or membrane or heat spreader or RDL or energy source or light source or battery.

46. The integrated circuit package according to claim 11, wherein said first substrate and said second substrate are electrically coupled using wire and/or redistribution layer.

47. The integrated circuit package according to claim 12, wherein said first substrate and said second substrate are electrically coupled using wire and/or redistribution layer.

48. The integrated circuit package according to claim 13, wherein said first substrate and said second substrate are electrically coupled using wire and/or redistribution layer.

49. The integrated circuit package according to claim 14, wherein said first substrate and said second substrate are electrically coupled using wire and/or redistribution layer.

50. The integrated circuit package according to claim 15, wherein said first substrate and said second substrate are electrically coupled using wire and/or redistribution layer.

* * * * *